United States Patent
Kawabata

(10) Patent No.: US 6,452,518 B1
(45) Date of Patent: Sep. 17, 2002

(54) A-D CONVERTING APPARATUS, AND CALIBRATION UNIT AND METHOD THEREFOR

(75) Inventor: Masayuki Kawabata, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/534,322

(22) Filed: Mar. 24, 2000

(30) Foreign Application Priority Data

Mar. 24, 1999 (JP) ............................................ 11-080118
Feb. 29, 2000 (JP) ....................................... 2000-054335

(51) Int. Cl.⁷ .......................... H03M 1/06; H03M 1/10; H03M 1/12
(52) U.S. Cl. ......................... 341/118; 341/120; 341/155
(58) Field of Search ................................. 341/118, 120, 341/155

(56) References Cited

U.S. PATENT DOCUMENTS

| | | | |
|---|---|---|---|
| 4,736,189 A | * 4/1988 | Katsumata et al. | 341/155 |
| 4,962,380 A | * 10/1990 | Meadows | 341/155 |
| 5,073,777 A | 12/1991 | Fukuhara et al. | 341/131 |
| 5,247,300 A | * 9/1993 | Sohn | 341/155 |
| 5,453,749 A | * 9/1995 | Morita | 341/155 |
| 5,537,113 A | 7/1996 | Kawabata | 341/141 |
| 6,310,571 B1 | * 10/2001 | Yang et al. | 341/155 |

FOREIGN PATENT DOCUMENTS

DE 38 85 166 T2 1/1989
GB 2 184 620 A 6/1987

OTHER PUBLICATIONS

Patent Abstracts of Japan, Publication No. 05218867 A; Aug. 27, 1993; 1 page.
German Official Action dated May 22, 2001, and translation thereof; 8 pages.
Patent Abstracts of Japan, Publication No. 06152410 A; May 31, 1994; 1 page.

* cited by examiner

Primary Examiner—Trong Phan
(74) Attorney, Agent, or Firm—Rosenthal & Osha L.L.P.

(57) ABSTRACT

Analog-to-digital (A-D) converting apparatus (100, 120, 130) for calibrating a time error includes: an analog signal input portion (10); a plurality of analog-to-digital converters (12); a sampling clock signal generator (14) which supplies either a synchronous sampling clock signal or an alternate sampling clock signal; an averaging processing unit (18b) which performs the averaging process on a digital signal output from the A-D converters, based on the synchronous sampling clock signal; and an interleave processing unit (118a) which interleaves a digital signal output from the sampling operated A-D converters, based on the alternate sampling clock signal. The A-D converting apparatus includes an error calculation unit (72) for calculating the time error, and an error calibration value calculating unit (74) and an error calibrating unit (70b) which performs calibration operation. Method of calibrating an error caused between a plurality of the A-D converters.

18 Claims, 16 Drawing Sheets

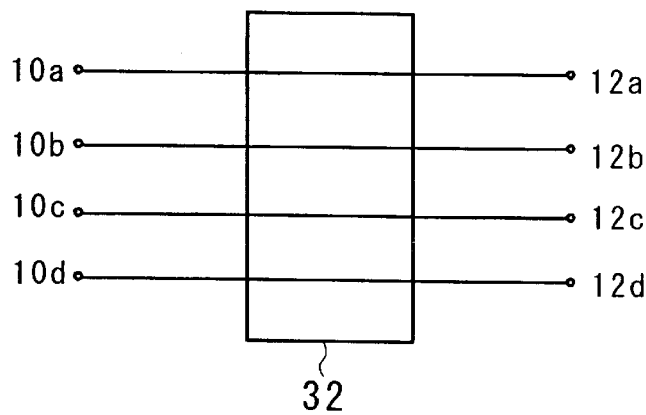
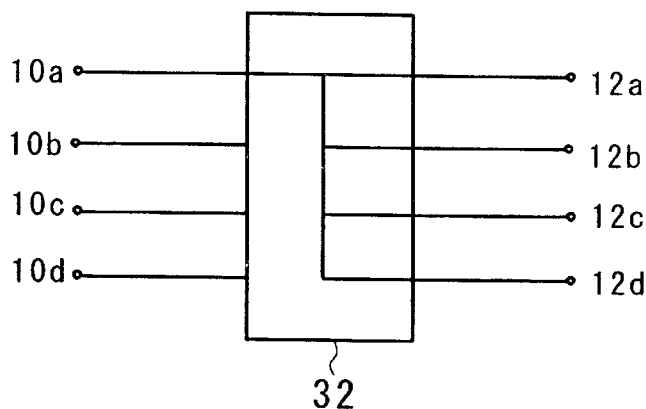
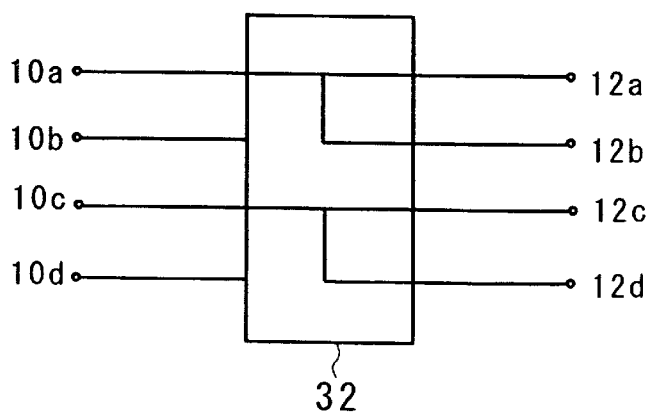
Fig. 10

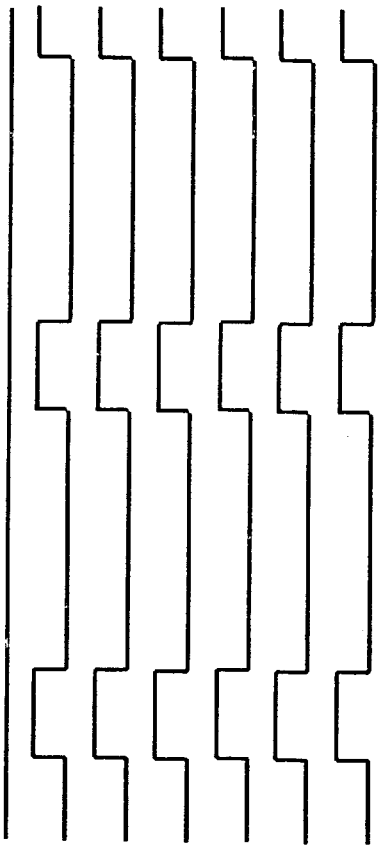
Fig. 11A  SAMPLING CLOCK SIGNAL
FOR USE IN AVERAGING PROCESSING
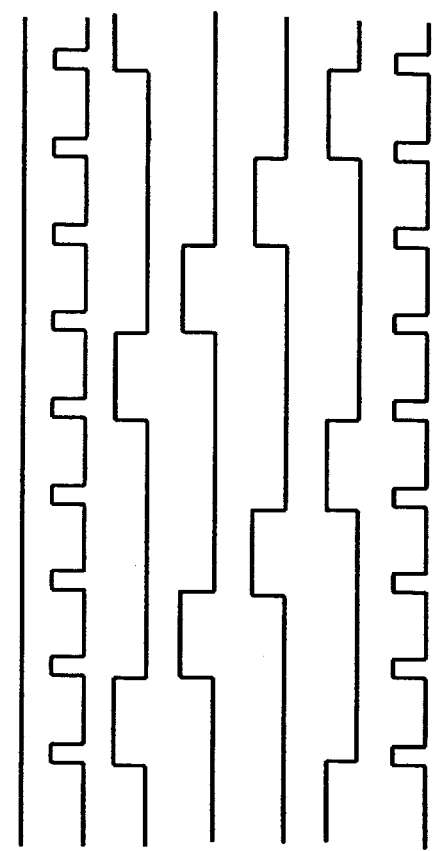
Fig. 11B  SAMPLING CLOCK SIGNAL
FOR USE IN INTERLEAVING

A-D CONVERTING APPARATUS, AND CALIBRATION UNIT AND METHOD THEREFOR

This patent application claims priority based on Japanese patent applications, H11-080118 filed on Mar. 24, 1999 and 2000-54335 filed on Feb. 29, 2000, the contents of which are incorporated herein by reference.

BACKGROUND OF THE INVENTION

1. Field of the Invention

The present invention relates to a semiconductor device testing apparatus and in particular to an A-D converter and a calibration unit incorporated in the semiconductor device testing apparatus.

2. Description of the Related Art

FIG. 1 is a block diagram showing a typical A-D converter 101, which converts an analog signal to a digital signal. The A-D converting apparatus 101 is comprised of an analog signal input portion 11, A-D converters 13a and 13b, a sampling clock signal generator 15, a reference clock signal generator 17, a delay circuit 24 and an interleave processing unit 19. The interleave processing unit 19 includes a multiplexer 29 and a memory unit 21.

An analog signal 50 is input to the analog signal input portion 11. The input analog signal 50 is sampled by the A-D converters 13a and 13b, which perform alternate sampling thereon, so as to be converted to a digital signal. The digital signals alternately output from the A-D converters 13a and 13b are put in a sequential order by the multiplexer 29, so as to be stored in a memory unit 21.

Based on a reference clock signal 54, the sampling clock signal generator 15 generates sampling clock signals 56a and 56b which alternately trigger the sampling operation of the A-D converters 13a and 13b. A delay circuit 24 calibrates the timing of the sampling operation of the A-D converters 13a and 13b, and i is arranged on a transfer path of the sampling clock signals 56a and 56b generated from the sampling clock signal generator 15.

FIG. 2 shows a readily available A-D converting apparatus 102 equipped with a plurality of analog signal portions. The A-D converting apparatus 102 includes A-D converters (13a, 13b, 13c, 13d) corresponding to a plurality of analog signal input portions (11a, 11b, 11c, 11d), respectively, a reference clock signal generator 17 and memory units (21a, 21b, 21c, 21d).

Respective analog signals (50a, 50b, 50c, 50d) are input to the respective analog signal input portions (11a, 11b, 11c, 11d). The input analog signals are converted to digital signals by the respective A-D converters (13a, 13b, 13c, 13d). The converted digital signals are stored in the memory units (21a, 21b, 21c, 21d).

FIG. 3A is a block diagram showing interleave processing. In interleave processing, sample data obtained from whichever of the two A-D converters 13a and 13b alternately sampling-operated, are put in sequential order by an interleave processing unit 19. By performing the interleave operation, sample data equivalent to a higher sampling rate than that of a single A-D converter is obtained. Referring to FIG. 3B, in interleave processing, the two A-D converters 13a and 13b are alternately triggered to sampling-operate, by supplying to the A-D converters two sampling clock signals 56a and 56b, whose respective phases are displaced from each other.

As mentioned above, interleave processing is a method by which digital signals output from a plurality of A-D converters are put in sequential order. In interleave processing, sampling sampling-operates, based on the sampling clock signal. However, in actuality, a time error occurs against a desired sampling clock, due to characteristic differences between respective A-D converters and those between the transfer paths of the sampling clock signal. Thus, calibration of the time error is necessary. As shown in FIG. 1, in the conventional practice, the time error is calibrated by providing a variable delay element in the midst of the path leading the sampling clock signals 56a and 56b to the respective A-D converters.

The conventional A-D converting apparatus 101 shown in FIG. 1 performs only the interleave process by which the A-D converters 13a and 13b are alternately sampling-operated. The A-D converting apparatus 101 cannot perform other processes.

In the conventional A-D converter 102 shown in FIG. 2, the A-D converter to be used for processing the analog signal input from each analog signal input portion is fixed in advance. Moreover, the delay circuit carries out calibration of the time error, making the calibration of the time error very complicated. Furthermore, the range in which the time error can be calibrated heavily depends on the performance of the delay circuit, so that high precision calibration cannot be performed.

SUMMARY OF THE INVENTION

Therefore, it is an object of the present invention to provide an A-D converting apparatus, a calibration unit and a semiconductor device testing apparatus and methods therefor to aid in solving at least one of the above disadvantages. These objects will be achieved by combining features described in the independent claims in the scope claims. Moreover, dependent claims provide further advantageous embodiments according to the present invention.

According to one aspect of the present invention, there is provided analog-to-digital (A-D) converting apparatus which samples an analog signal output from a semiconductor device under test to produce a digital signal, comprising: an analog signal input portion which inputs the analog signal; a plurality of analog-to-digital (A-D) converters which samples the analog signal input at said analog signal input portion, and convert the analog signal to the digital signal; a sampling clock signal generator which supplies either a synchronous sampling clock signal for use with an averaging process so as to sampling-operate the plurality of A-D converters in a synchronized manner, or an alternate sampling clock signal for use with an interleave process so as to alternately sampling-operate the plurality of A-D converters; an averaging processing unit which performs the averaging process on the digital signal output from the sampling-operated A-D converters, based on the synchronous sampling clock signal; and an interleave processing unit which interleaves the digital signal output from the sampling operated A-D converters, based on the alternate sampling clock signal.

The A-D converting apparatus may further comprise a mode specifying signal generator which generates a mode specifying signal which specifies either the averaging process or the interleave process, whereby either the averaging process unit or the interleave processing unit is selected based on the mode specifying signal.

Moreover, the A-D converting apparatus may further comprise a reference clock signal generator which generates a reference clock signal, wherein the sampling clock signal generator supplies the synchronous sampling clock signals synchronized with the reference clock signal to the respective A-D converters in the event that the averaging process is specified by the mode specifying signal while said sampling clock signal generator supplies the alternate sampling clock signal each having a different phase from other to said respective A-D converters in the event that the interleave process is specified by the mode specifying signal.

Moreover, the A-D converting apparatus may further comprise a plurality of memory units which store the digital signals output from the respective plurality of A-D converters, wherein the averaging processing unit and the interleave processing unit perform the averaging process and the interleave process, respectively, based on the digital signal stored in the plurality of memory units.

Suppose that there are a first A-D converter and a second A-D converter, the A-D converting apparatus may further comprise: an error calculation unit which calculates a time error which is a time displacement between a predetermined timing sampled by the second A-D converter against that sampled by the first A-D converter and an actual timing sampled by the second A-D converter; an error calibration value calculating unit which calculates a time error calibration value for use with calculation of calibrating the time error of the second A-D converter, based on the time error calculated by the error calculation unit; a read-out unit which reads the digital signal from the memory units which store the digital signal obtained by sampling a measured signal that is the analog signal to be measured; and an error calibrating unit which performs a calibration operation on the time error caused in the second A-D converter in the event of sampling the measured signal, based on the digital signal read out of said memory units by the read-out unit and the time error calibration value calculated by the error calibration value calculating unit.

According to another aspect of the present invention, there is provided analog-to-digital (A-D) converting apparatus comprising: an analog signal input portion which inputs the analog signal; an adder which adds up the digital signal output from a first A-D converter which sampling-operates the analog signal so as to be converted to the digital signal, and the digital signal output from a second A-D converter which sampling-operates the analog signal so as to be converted to the digital signal; a multiplexer which alternately inputs the digital signal output from the first A-D converter and the digital signal output from the second A-D converter so as to be sequentially output; and a selector which selects either an output value from said adder or an output value from said multiplexer.

According to still another aspect of the present invention, there is provided analog-to-digital (A-D) converting apparatus comprising: an analog signal input portion which inputs the analog signal; a plurality of analog-to-digital (A-D) converters which perform sampling operation on the analog signal input at the analog signal input portion, and convert the analog signal to the digital signal; and an analog signal distributor which distributes the digital signal to a single of or plurality of the A-D converters depending on a content of how the measured signal is converted to the digital signal.

Moreover, it is also preferable that a plurality of A-D converters are provided for the respective number of the corresponding plurality of analog signal input portions, and that the analog signal input from the single analog input portion is distributed to a plurality of the A-D converters.

Moreover, the A-D converting apparatus may further comprise: a sampling clock signal generator which supplies either a synchronous sampling clock signal for use with an averaging process so as to sampling-operate the plurality of A-D converters in a synchronized manner, or an alternate sampling clock signal for use with an interleave process so as to alternately sampling-operate the plurality of A-D converters; an averaging processing unit which performs the averaging process on the digital signal output from the sampling-operated A-D converters, based on the synchronous sampling clock signal; and an interleave processing unit interleaves the digital signal output from the sampling operated A-D converters, based on the alternate sampling clock signal.

Moreover, the A-D converting apparatus may further comprise: a mode specifying signal generator which generates a mode specifying signal which specifies either the averaging process or the interleave process, whereby either the averaging process unit or the interleave processing unit is selected based generator which supplies to the analog signal distributor a distribution control signal specifying that the analog signal be distributed to one of or plurality of said A-D converters, based on a process specified by the mode specifying signal.

According to still another aspect of the present invention, there is provided calibration apparatus which calibrates an error arising between a first A-D converter that performs sampling operation on an analog signal output from a semiconductor device so as to be converted to a digital signal and a second A-D converter that performs sampling operation on the analog signal so as to be converted to a digital signal, the calibration apparatus comprising: an error calculation unit which calculates a time error which is a time displacement between a predetermined timing sampled by the second A-D converter against that sampled by the first A-D converter and an actual timing sampled by the second A-D converter samples, based on sample data obtained by sampling a test signal for use in calculating the time error; an error calibration value calculating unit which calculates a time error calibration value for use with calculation of calibrating the time error of the second A-D converter, based on the time error calculated by the error calculation unit; a read-out unit which reads the digital signal from a memory unit which stores the sample data obtained by sampling a measured signal that is the analog signal to be measured; and an error calibrating unit which performs a calibration operation on the time error caused in the second A-D converter in the event of sampling the measured signal, based on the sample data read out of the memory unit by the read-out unit and the time error calibration value calculated by the error calibration value calculating unit.

In the calibration apparatus, it is desirable that the error calibrating unit performs discrete Fourier transformation on the sample data of the measured signal read out of the memory unit by the read-out unit, and calibrates the time error based on a discrete Fourier transformed value obtained from the discrete Fourier transformation and the time error calibration value.

Moreover, it is preferable that the error calculation unit calculates a gain and offset of the first and second A-D converters, and the error calibration value calculating unit includes: a gain calibration value calculating unit which calculates a gain calibration value of the first and second A-D converters; and an offset calibration value calculating unit which calculates an offset calibration value of the first and second A-D converters, and the error calibrating unit includes a gain-offset calibrating unit which calibrates the gain and offset of the first and second A-D converters, based on the sample data of the measured signal read out of the memory unit by the read-out unit, the gain calibration value and the offset calibration value.

In the calibration apparatus, it is preferable that the gain-offset calibrating unit performs a calibrating operation such that the gain calibration value is multiplied to the sample value of the measured signal sampled by the second A-D converter and then the offset calibration value is added.

According to still another aspect of the present invention, there is provided a method of calibrating an error arising between a first A-D converter which performs sampling operation on an analog signal to produce a digital signal so s to be converted to a digital signal and a second A-D converter which performs sampling operation on the analog signal so as to be converted to a digital signal, the error calibrating method comprising: calculating a time error which is a time displacement between a predetermined timing sampled by the second A-D converter against that sampled by the first A-D converter and an actual timing sample by the second A-D converter; calculating a time error calibration value for use with calculation of calibrating the time error, based on the time error; and calibrating the time error based on sample data obtained by sampling a signal to be measured and the time error calibration value.

Moreover, the method may further comprise: calculating an gain and offset of the first and second A-D converters; calculating gain calibration value and offset calibration value for use with calculation of calibrating the gain and offset, based on the gain and offset calculating by said calculating the gain and offset; and calibrating the gain and offset of the first and second A-D converters, based on the sample data obtained by sampling the signal to be measured, the gain calibration value and the offset calibrating value.

According to still another aspect of the present invention there is provided a recording medium which stores a program for calibrating a time error which is a time displacement between a predetermined timing sampled by the second A-D converter against that sampled by the first A-D converter and an actual timing sampled by the second A-D converter, wherein the program of the recording medium comprises: a first module for calculating the time error; a second module for calculating a time error calibration value for use with calculation of calibrating the time error of the second A-D converter based on the calculated time error; and a third module for calibrating the time error based on sample data obtained by sampling a signal to be measured and the time error calibration value.

Moreover, in the recording medium the program may further comprise: a fourth module for calculating gain and offset; a fifth module for calculating a gain calibration value for use in calibrating the gain and an offset calibration value for use in calibrating the offset, based on the gain and offset calculated by said fourth module; and a sixth module which calibrates the gain and offset of the first and second A-D converters, based on the sample data obtained by sampling the signal to be measured, the gain calibration value and the offset calibration value.

According to still another aspect of the present invention, there is provided semiconductor device testing apparatus for testing a semiconductor device that outputs an analog signal, comprising: a pattern generator which generates a semiconductor device input signal for testing the semiconductor device; a performance board which supplies to the semiconductor device the semiconductor device input signal output from said pattern generator; an analog signal input portion which inputs the analog signal output from the semiconductor device; a plurality of analog-to-digital (A-D) converters which perform sampling operation on the analog signal input at said analog signal input portion, and convert the analog signal to a digital signal; a sampling clock signal generator which supplies either a synchronous sampling clock signal for use with an averaging process so as to sampling-operate said plurality of A-D converters in a synchronized manner, or an alternate sampling clock signal for use with an interleave process so as to alternately sampling-operate said plurality of A-D converters; an averaging processing unit which performs the averaging process on the digital signal output from said sampling-operated A-D converters, based on the synchronous sampling clock signal; and an interleave processing unit which interleaves the digital signal output from the sampling operated A-D converters, based on the alternate sampling clock signal.

Moreover, in the semiconductor device testing apparatus, suppose that the plurality of A-D converters includes a first A-D converter and a second A-D converter, then it may further comprise: an error calculation unit which calculates a time error which is a time displacement between a predetermined timing sampled by the second A-D converter against that sampled by the first A-D converter and an actual timing sampled by the second A-D converter; an error calibration value calculating unit which calculates a time error calibration value for use with calculation of calibrating the time error of the second A-D converter, based on the time error calculated by said error calculation unit; a read-out unit, connected to said error calculation unit, which reads the digital signal from a memory unit which stores the digital signal obtained by sampling a measured signal that is the analog signal to be measured; and an error calibrating unit which performs a calibration operation on the time error caused in the second A-D converter in the event of sampling the measured signal, based on the sample data read out of the memory unit and the time error calibration value calculated by said error calibration value calculating unit.

This summary of the invention does not necessarily describe all necessarily features so that the invention may also be sub-combination of these described features.

BRIEF DESCRIPTION OF THE DRAWINGS

FIG. 10A shows a distribution method for distribution of the analog signal to the A-D converter in a 1-1 manner.

FIG. 10B shows a method of distributing the analog signal to the A-D converter in a 1-4 manner.

FIG. 10C shows another preferred embodiment, where a 1-2 distribution is adopted.

FIG. 11A is a timing chart of the sampling clock signal for use with the averaging process, output from the sampling clock signal generator 14.

FIG. 11B is a timing chart of the sampling clock signal for use with the interleave process, output from the sampling clock signal generator 14.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
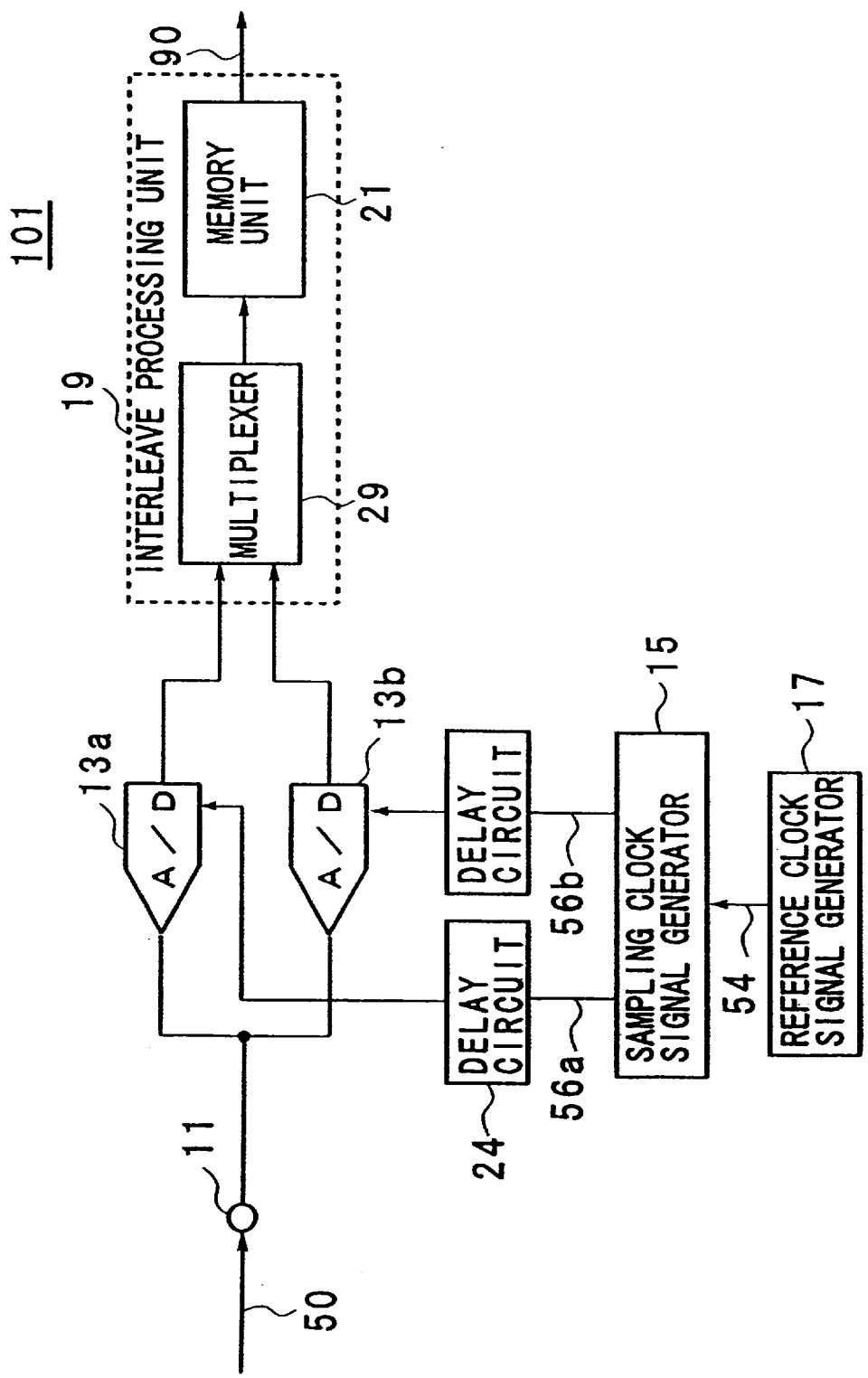
FIG. 1 is a block diagram showing a typical A-D converter 101, which converts an analog signal to a digital signal.
Figure 2:
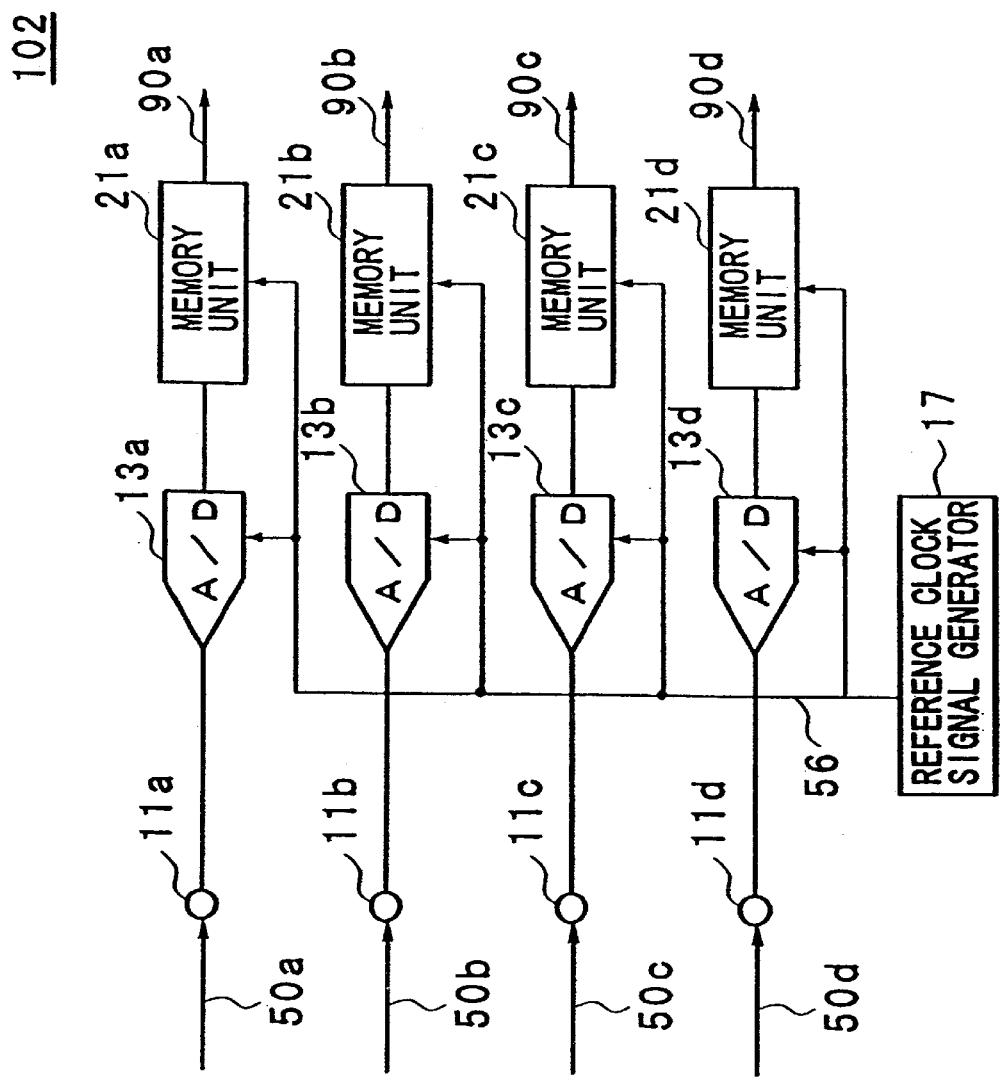
FIG. 2 shows an A-D converting apparatus 102 equipped with a plurality of analog signal portions.
Figure 3A:
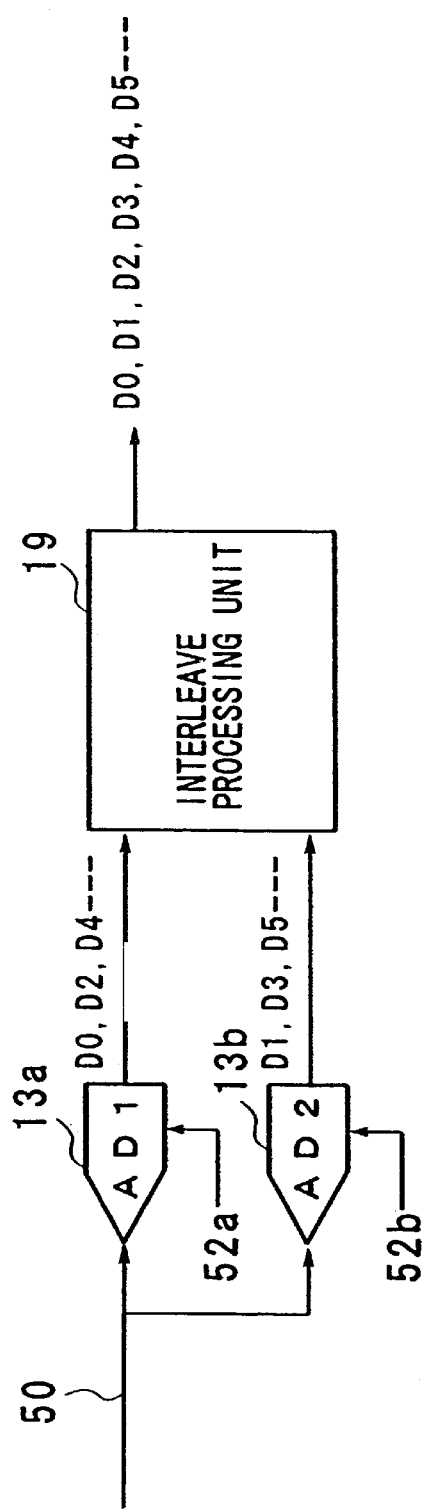
FIG. 3A is a block diagram showing interleave processing.
Figure 3B:
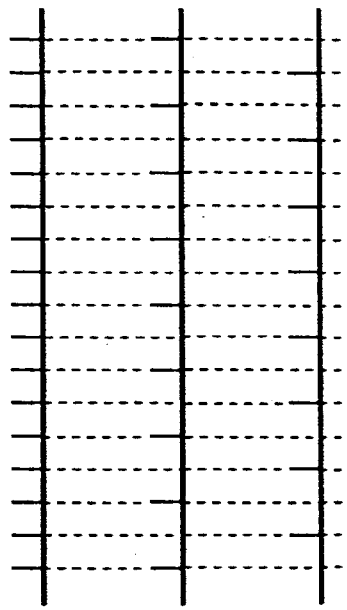
FIG. 3B is a sampling timing diagram of two sampling clock signals in interleave processing.
Figure 4:
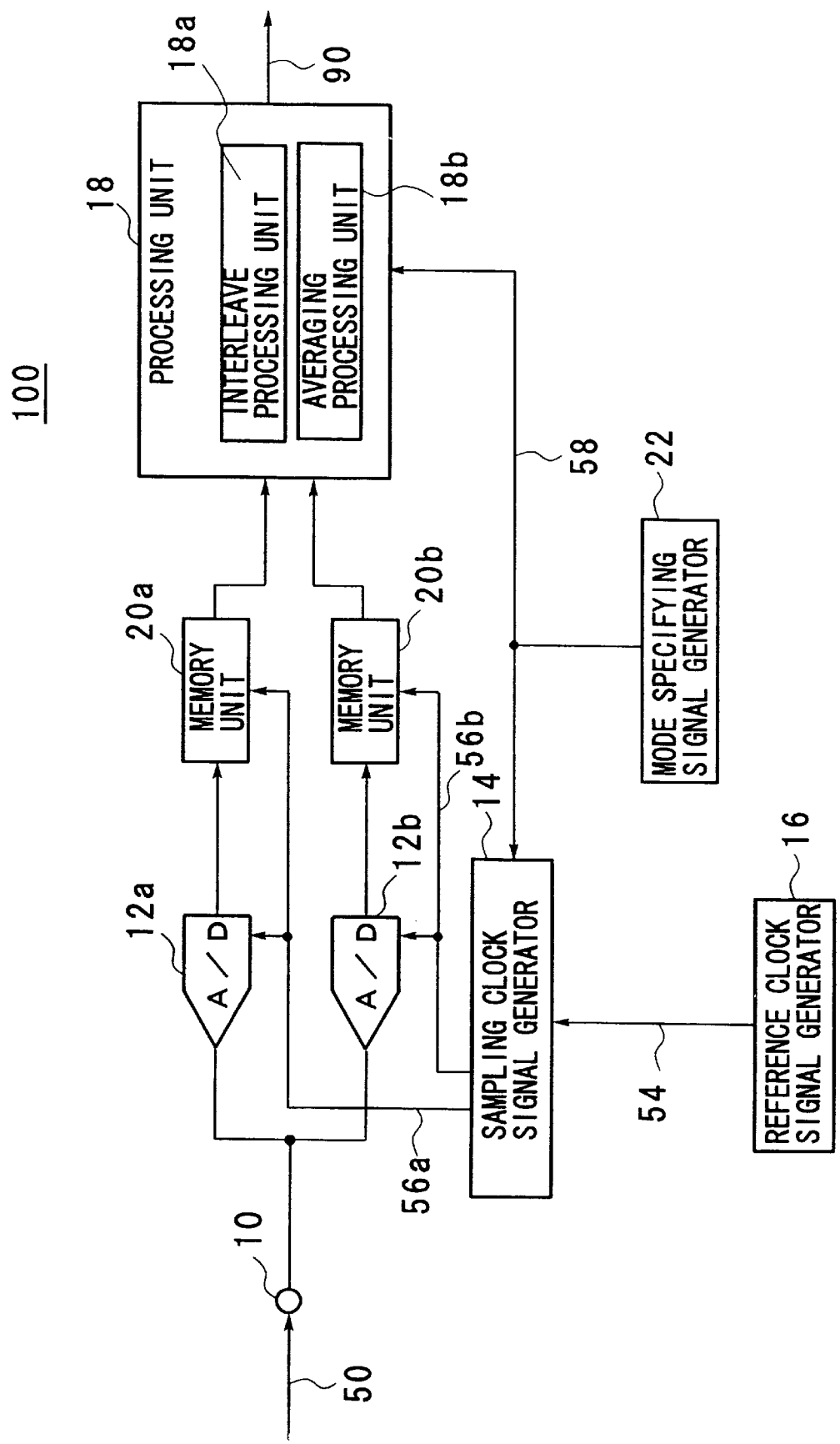
FIG. 4 is a block diagram showing an A-D converting apparatus 100 according to the first embodiment.

FIG. 4 is a block diagram showing an A-D converting apparatus 100 according to the first embodiment. The A-D converting apparatus 100 comprises: an analog signal input portion 10, A-D converters 12a and 12b, a sampling clock signal generator 14, a reference clock signal generator 16, a processing unit 18, memory units 20a and 20b, and a mode specifying signal generator 22. The processing unit 18 comprises an interleave processing unit 18a and an averaging processing unit 18b.

According to the present embodiment, the interleave processing unit 18a in the processing unit 18 performs the interleave process, in which the sample data obtained from the alternate sampling operation in the two A-D converters 12a and 12b are put in alternating order. As a result of interleave processing, the A-D converting apparatus 100 can obtain sample data of a single A-D converter 12a or 12b, equivalent to that obtained at a double sampling rate.

The averaging processing unit 18b performs a process to average the sample data obtained from the sampling operations performed simultaneously by the two A-D converters 12a and 12b. As a result of this averaging process, twice as much resolution as the quantization resolution of a single A-D converter 12a or 12b can be obtained. For example, when the sampling operations are performed simultaneously using two A-D converters whose quantization resolution is 10 bits (range: −512 to +511), the summation of digital signals output from the respective A-D converters results in data of −1024 to +1023, so that a resolution of approximately 11 bits can be obtained. When an analog signal having the amplitudes of −1.024 to +1.023 is sampled, the quantization resolution for a single A-D converter of 10 bits is 1 mV, while the quantization resolution for two A-D converters of 10 bits each is 0.5 mV.

The averaging process may include taking median, medium and average of data, and oftentimes the so-called taking average of the data is adopted.

The mode specifying signal generator 22 generates a mode specifying signal 58 which specifies each constituent element of the A-D converting apparatus 100, to operate either an averaging processing mode or an interleave processing mode. The mode specifying signal 58 is supplied to the processing unit 18 and the sampling clock signal generator 14. In the processing unit 18, either the interleave processing unit 18a or the averaging processing unit 18b is selected, based on the mode specifying signal 58.

Moreover, the sampling clock signal generator 14 generates a sampling clock signal necessary to operate each A-D converter 12a or 12b, based on the reference clock signal 54 supplied from the reference clock signal generator 16 and the mode specifying signal 58 supplied from the mode specifying signal generator 22. When the mode specifying signal 58 is a signal specifying the averaging processing mode, the sampling clock signal generator 14 supplies to each of A-D converters 12a and 12b a sampling clock signal for use with the averaging process, so as to sampling-operate both the A-D converters 12a and 12b simultaneously.

When the mode specifying signal 58 is a signal to specify the interleave processing mode, the sampling clock signal generator 14 supplies to each of A-D converters 12a and 12b a sampling clock signal for use with the interleaving process, so as to sampling-operate the A-D converters 12a and 12b alternately.

The analog signal 50 is sampled by the A-D converters 12a and 12b, which are sampling-operated by the sampling clock signals generated from the sampling clock signal generator 14, and the sample data is digitized by the A-D converters 12a and 12b. When the sampling clock signal generator 14 generates the sampling clock signal for use with the averaging process, the analog signal 50 is sampled while it is being synchronized with the reference clock signal 54. When the sampling clock signal generator 14 generates the sampling clock signal for use with the interleave process, the analog signal 50 is alternately sampled. The sample data digitized by the A-D converters 12a and 12b is stored in the memory units 20a and 20b respectively.

It is desirable that the memory unit be provided for each A-D converter. The sample data stored in the memory units 20a and 20b are processed by either the interleave processing unit 18a or the averaging processing unit 18b, selected based on the mode specifying signal 58.

The interleave processing unit 18 performs the interleaving process by which the sample data are put in alternating order. For example, the interleave processing unit 18a converts the digitized sample data stored in the memory units 20a and 20b to voltage data, based on the voltage conversion factor which converts digital signals to voltage data, so that the respective converted voltage data are put in alternating order. The averaging processing unit 18b performs the averaging process on the sample data, so as to be averaged. For example, the averaging processing unit 18b converts the digitized sample data stored in the memory units 20a and 20b to voltage data, based on the voltage conversion factor, and then adds together each converted voltage datum.

Figure 5:
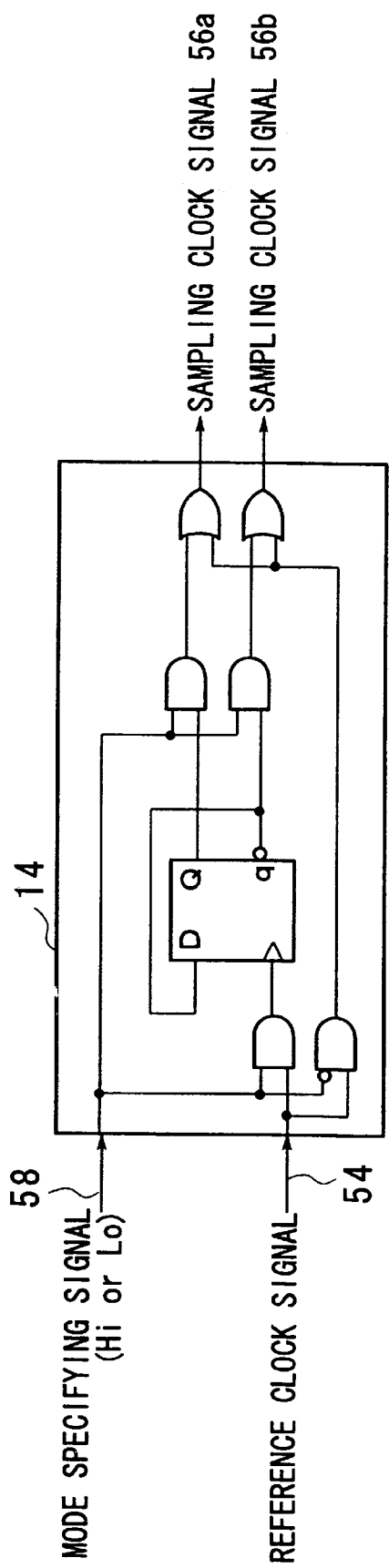
FIG. 5 is a block diagram showing an embodiment of the sampling clock signal generator 14.

FIG. 5 is a block diagram showing an embodiment of the sampling clock signal generator 14. In this embodiment, the mode specifying signal 58 is a binary signal, which is expressed by two voltage values, Hi (logical value "1") and Lo (logical value "0"). Hi specifies the interleave processing mode, and Lo specifies the averaging process mode. The sampling clock signal generator 14 generates each of the sampling clock signals for use with the averaging process and the interleave process, based on the reference clock signal 54.

When the mode specifying signal 58 is Hi, the sampling clock signal generator 14 outputs the sampling clock signal which alternately sampling-operates the A-D converters 12a and 12b, based on the reference clock signal 54 generated by the reference clock signal generator 16. When the mode specifying signal 58 is Lo, the sampling clock signal generator 14 outputs the sampling clock signal synchronized with the reference clock signal 54, for use with the averaging process, so that the A-D converters 12a and 12b perform the sampling operation simultaneously, based on a phase of the reference clock signal 54 generated from the reference clock signal generator 16.

Figure 6A:
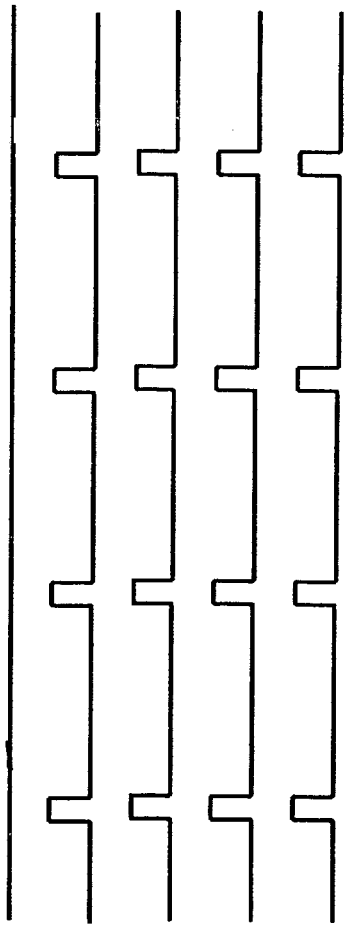
FIG. 6A is a timing chart of the sampling clock signal for use with the averaging process, output from the sampling clock signal generator 14 shown in FIG. 5.

FIG. 6A is a timing chart of the sampling clock signal for use with the averaging process, output from the sampling clock signal generator 14 shown in FIG. 5. When the mode specifying signal 58 is Lo, thereby specifying the averaging processing mode, the sampling clock signals 56a and 56b are output, synchronized with the reference clock signal 54. The A-D converters 12a and 12b then perform the sampling operation, based on the sampling clock signals 56a and 56b. The timing of this sampling operation is synchronized with the reference clock signal 54.

Figure 6B:
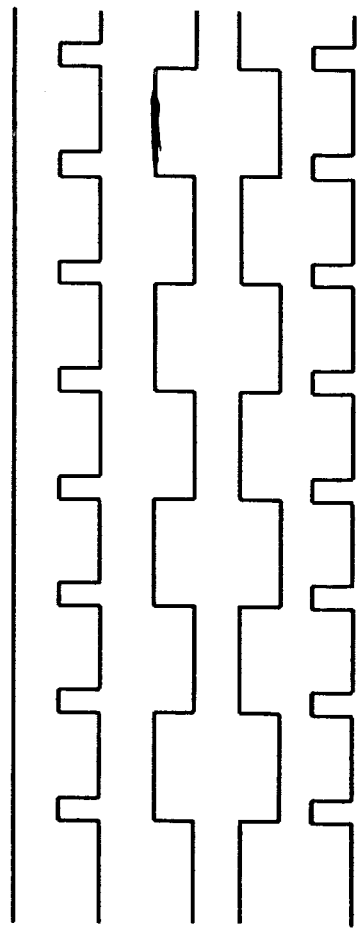
FIG. 6B is a timing chart of the sampling clock signal for use with the interleave process, output from the signal generator 14 shown in FIG. 5.

FIG. 6B is a timing chart of the sampling clock signal for use with the interleave process, output from the signal generator 14 shown in FIG. 5. When the mode specifying signal 58 is Hi, thereby specifying the interleave processing mode, the sampling clock signal 56a is output in a manner such that the frequency of the reference clock signal 54 is halved, while the sampling clock signal 56b is output such that a phase of the sampling clock signal whose frequency is halved is shifted further by a half. The A-D converters 12a and 12b perform the sampling operation based on the sampling clock signals 56a and 56b. The timing of this sampling operation is synchronized with the reference clock signal 54.

In general, in order for an A-D converter to convert an analog signal to a digital signal, a certain fixed period of time (referred to as sampling time hereafter) is required. Thus, the maximum sampling rate attainable by a single A-D converter during a fixed time is predetermined for the A-D converter in question. The interleaving process then becomes effective, which alternately operates a plurality of A-D converters.

By implementing the interleaving process, an analog signal can be converted to a digital signal at a sampling rate greater than that of each A-D converter, without increasing the sampling rate of each A-D converter. For instance, in the case of the averaging process, the period of the reference clock signal 54 cannot be made smaller than the sampling time in the reference clock signal generator 16. However, in the case of the interleaving process, the period of the reference clock signal 54 can be made smaller than the sampling time of each A-D converter in the reference clock signal generator 16.

Figure 7:
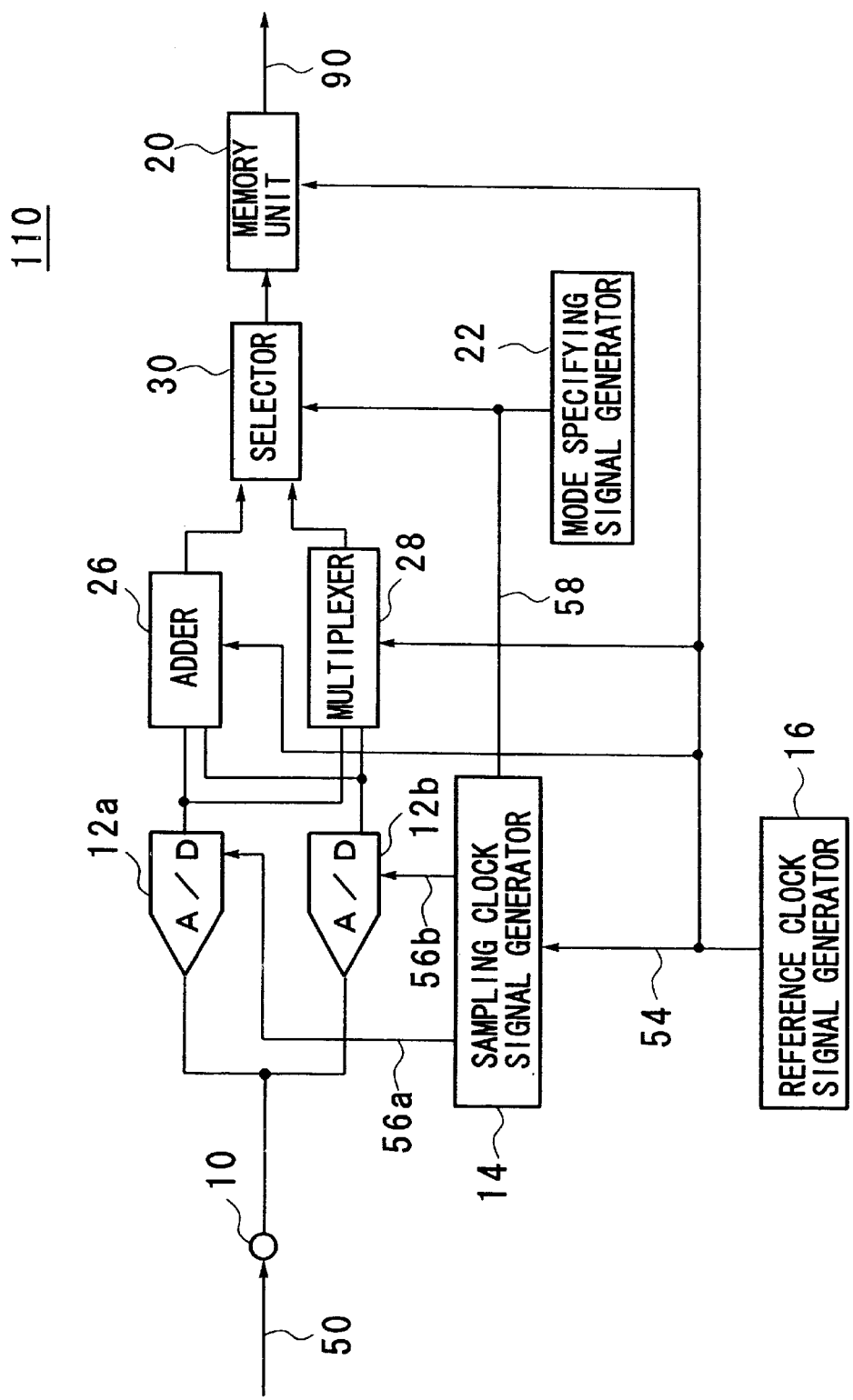
FIG. 7 shows another embodiment in which the A-D converting apparatus 110 comprises the analog signal input portion 10, the A-D converters 12a and 12b, the sampling clock signal generator 14, the reference clock signal generator 16, the memory unit 20, the mode specifying signal generator 22, an adder 26, the multiplexer 28 and a selector 30.

FIG. 7 shows another embodiment in which the A-D converting apparatus 110 comprises the analog signal input portion 10, the A-D converters 12a and 12b, the sampling clock signal generator 14, the reference clock signal generator 16, the memory unit 20, the mode specifying signal generator 22, an adder 26, the multiplexer 28 and a selector 30. The multiplexer 28 is provided in order to serve as the interleave processing unit 18a described in FIG. 4. The adder 26 is provided in order to serve as the averaging processing unit 18b described in FIG. 4. The structures shown in FIG. 7 are given the same numbers as in FIG. 4 if they correspond to elements having the same structure or function as in FIG. 4.

The analog signal 50 is input to the analog signal input portion 10. The input analog signal 50 is sampled by the A-D converters 12a and 12b, which sampling-operates based on the sampling clock signals 56a and 56b supplied from the sampling clock signal generator 14. The sampling clock signal generator 14 generates either the sampling clock signal for use with the averaging process, or the sampling clock signal for use with the interleave process, based on the mode specifying signal 58 supplied from the mode specifying signal generator 22. The digital signals output from respective A-D converters are output to the adder 26 and the multiplexer 28.

The adder 26 and the multiplexer 28 operate based on the reference clock signal 54 generated from the reference clock signal generator 16. The adder 26 adds together the digital signals output from the A-D converters 12a and 12b, at the timing of the reference clock signal 54. The multiplexer 28 alternately selects A-D converters 12a and 12b at the timing of the reference clock signal 54. In this way, the mutliplexer 28 can output sequentially to the selector 30, the digital signals generated by the A-D converters 12a and 12b.

The digital signals output from the adder 26 and the multiplexer 28 are selected by the selector 30, which operates based on the mode specifying signal 58 supplied from the mode specifying signal generator 22, so that either the signal from the adder 26 or the signal from the multiplexer 28 is output to the memory unit 20. For example, when the mode specifying signal 58 is a signal that specifies the averaging process mode, the selector 30 selects the digital signal output from the adder 26 to be output to the memory unit 20. When the mode specifying signal 58 is a signal that specifies the interleave processing mode, the selector 30 selects the digital signal output from the multiplexer 28 to be output to the memory unit 20. Since the averaging process and the interleave process are performed by the adder 26 and the multiplexer 28, respectively, in this embodiment, the memory unit stores the digital signal which is either averaging-processed or interleave-processed. Thus, as described in the embodiment with reference to FIG. 4, high-speed averaging and interleave processes can be performed. By implementing such a structure described above, an A-D converting apparatus 110 is provided which can selectively perform the averaging process which sampling-operates a plurality of A-D converters simultaneously, and the interleave process.

Figure 8:
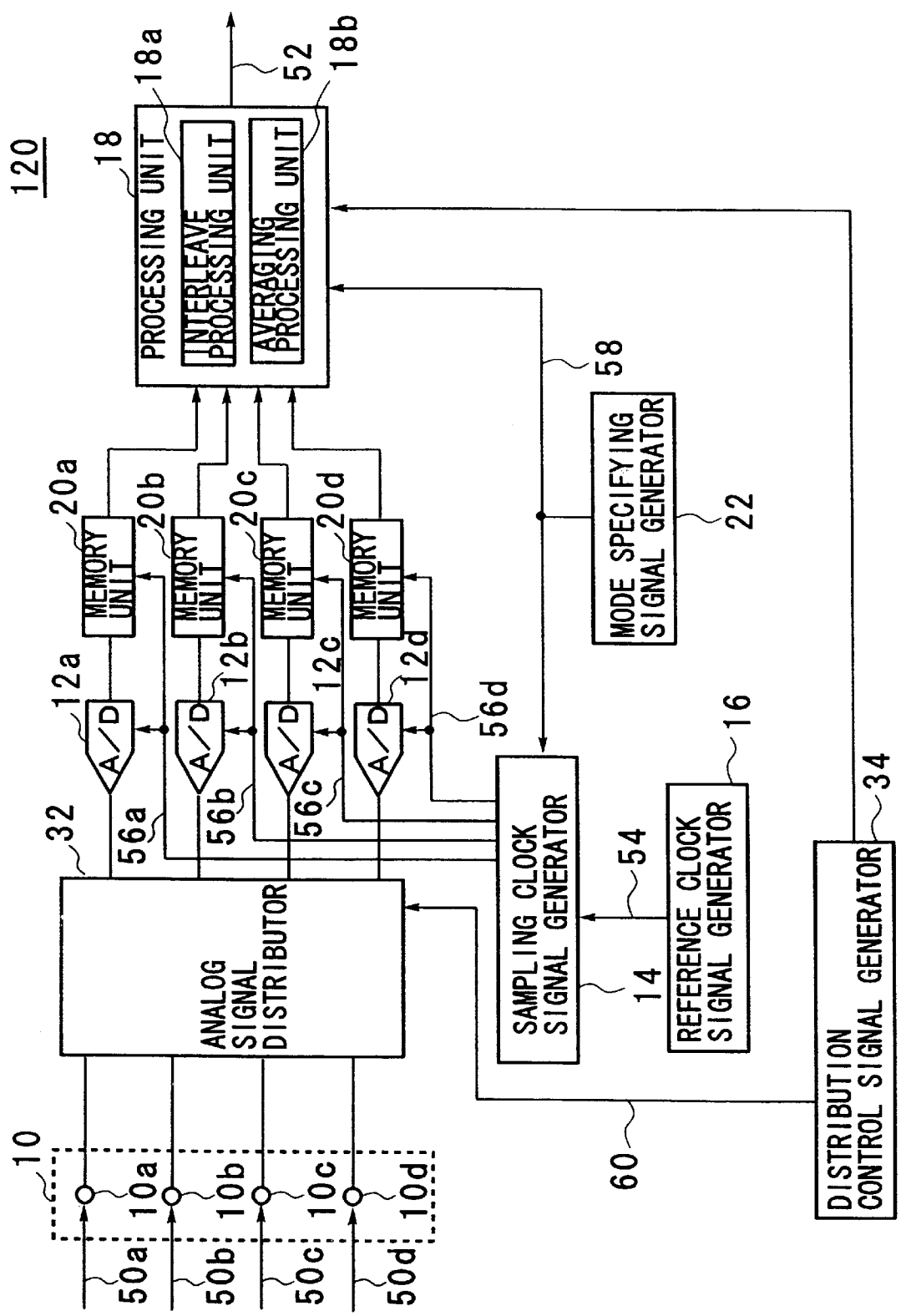
FIG. 8 is a block diagram showing an A-D converting apparatus 120 according to the second embodiment.

FIG. 8 is a block diagram showing an A-D converting apparatus 120 according to the second embodiment. The A-D converting apparatus 120 comprises a plurality of analog signal input portions (10a, 10b, 10c, 10d), A-D converters (12a, 12b, 12c, 12d), the sampling clock signal generator 14, the reference clock signal generator 16, the processing unit 18, memory units (20a, 20b, 20c, 20d), the mode specifying signal generator 22, an analog signal distributor 32 and a distribution control signal generator 34. The processing unit 18 includes the interleave processing unit 18a and the averaging processing unit 18b. The constituent elements in FIG. 8 having the same numbers as found in FIG. 4, have the same functions and perform the same operations as described with reference to FIG. 4.

In this second embodiment, the interleave processing unit 18a puts into alternating order the sample data obtained from the alternate sampling operation performed by the four A-D converters (12a, 12b, 12c, 12d), so as to perform the interleave process. As a result of the interleave process, the A-D converting apparatus 120 can obtain sample data of the single A-D converter (12a, 12b, 12c, 12d), equivalent to that obtained at a sampling rate four times faster.

The averaging processing unit 18b performs an averaging process on the sample data obtained by the four A-D converters (12a, 12b, 12c, 12d), which sampling-operate simultaneously. As a result of this averaging process, four times as much as the quantization resolution of a singe A-D converter (12a, 12b, 12c or 12d) can be obtained.

The mode specifying signal generator 22 generates the mode specifying signal 58, which specifies that each constituent element in the A-D converting apparatus be operated by either the averaging process mode or the interleave processing mode. The mode specifying signal 58 is supplied to the processing unit 18 and the sampling clock signal generator 14. In the processing unit 18, either the interleave processing unit 18a or the averaging processing unit 18b is selected, based on the mode specifying signal 58.

A distribution control signal 60 is a signal specifying to which A-D converter(s) (12a, 12b, 12c, 12d) the analog signal(s) (50a, 50b, 50c, 50d) shall be distributed. In this second embodiment, the distribution control signal generator 34 generates the distribution control signals 60, one of which specifies to distribute a single analog signal to four A-D converters (1-4 distribution), and another of which specifies to distribute a single analog signal to a single A-D converter (1-1 distribution). Note that the distribution control signal generator 34 generates either the 1-4 distribution signal or the 1—1 distribution signal.

The analog signal distributor 32 distributes the input analog signals (50a, 50b, 50c, 50d) to the A-D converter(s) (12a, 12b, 12c, 12d), based on the distribution control signal supplied from the distribution control signal generator 34.

For example, when the distribution control signal 60 specifies the 1-4 distribution and the analog signal distributor 32 selects the analog signal 50a, the analog signal 50a is distributed to the A-D converters (12a, 12b, 12c, 12d). When the interleave processing mode is specified by the mode specifying signal 58, the analog signal 50a is interleave processed, utilizing sample data obtained from the four A-D converters (12a, 12b, 12c, 12d). Thus, sample data sampled at four times the sampling rate of a single A-D converter 12a (12b, 12c or 12d) is obtained. Then, the remaining analog signals 50b, 50c and 50d are not distributed to the A-D converter.

When the averaging processing mode is specified by the mode specifying signal 58, the analog signal 50a input from the analog signal input portion 10a is averaging processed, utilizing sample data obtained from the four A-D converters (12a, 12b, 12c, 12d). Thus, four times more quantization resolution compared to that of a single A-D converter 12a (12b, 12c or 12d) can be obtained. Then, the remaining analog signals 50b, 50c and 50d are not distributed to any of the A-D converters.

Moreover, when the distribution control signal 60 specifies 1—1 distribution, the analog signals (50a, 5b, 50c, 50d) are distributed to the four A-D converters (12a, 12b, 12c, 12d), respectively. By this distribution, each A-D converter (12a, 12b, 12c, 12d) can sample the analog signal (50a, 50b, 50c, 50d).

The sampling clock signal generator 14 generates the sampling clock signals (56a, 56b, 56c, 56d), based on the reference clock signal 54 generated from the reference clock signal generator 16 and the mode specifying signal generated from the mode specifying signal generator 22. When the mode specifying signal 58 specifies the averaging processing mode, the sampling clock signal generator 14 supplies to the respective A-D converters (12a, 12b, 12c, 12d) the sampling clock signal for use with the averaging process, which sampling-operates the four A-D converters (12a, 12b, 12c, 12d) simultaneously.

When the mode specifying signal 58 specifies the interleave processing mode, the sampling clock signal generator 14 supplies to the respective A-D converters (12a, 12b, 12c, 12d) the sampling clock signal for use with the interleave process, which sampling-operates the four A-D converters (12a, 12b, 12c, 12d) alternately.

The analog signals (50a, 50b, 50c, 50d) distributed to the A-D converters (12a, 12b, 12c, 12d) are sampled by the AD converters (12a, 12b, 12c, 12d), which sampling-operate based on the sampling clock signals (56a, 56b, 56c, 56d), and their sample data is digitized. The sample data digitized by the A-D converters (12a, 12b, 12c, 12d) are stored in the memory units (20a, 20b, 20c, 20d), respectively.

The interleave processing unit 18a performs the interleave process, which puts the sample data in an alternating order. For example, in the interleave processing until 18a, the digitized sample data stored in the memory units (20a, 20b, 20c, 20d) are converted to voltage data based on the voltage conversion factor, which converts digital signals to voltage data, so that the respective converted data are put in alternating order. Thus, the voltage data of the analog data can be obtained in an interval of the sampling period. The averaging processing until 18b performs the averaging process by which the sample data are averaged. For example, the averaging processing unit 18b converts the digital signals stored in the memory units (12a, 12b, 12c, 12d) to voltage data, based on the voltage conversion factor, and then adds together each voltage datum. Using the structure shown in FIG. 8, in the A-D converting apparatus 100, the input analog signals (50a, 50b, 50c, 50d) can be selectively processed using a single A-D converter or a plurality of A-D converters (12a, 12b, 12c, 12d), based on the mode specifying signal 58 and the distribution control signal 60.

Figure 9:
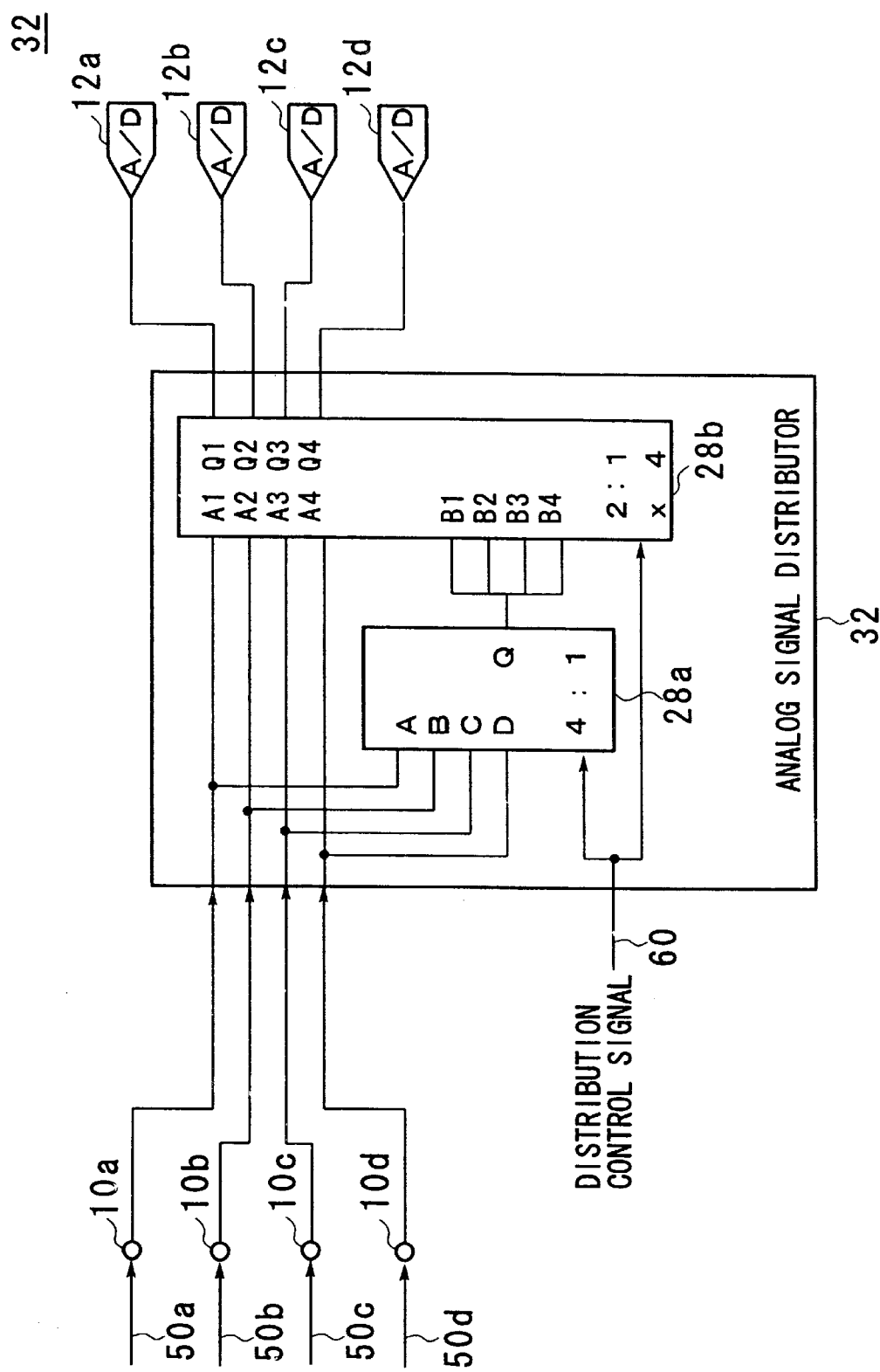
FIG. 9 shows an embodiment of the analog signal distributor 32.

FIG. 9 shows an embodiment of the analog signal distributor 32. The analog signal distributor 32 comprises a mutliplexer 28a, which distributes the input signals and output signals in a 4-1 ratio, and a mutliplexer 28b, which distributes the above mentioned signals in a 2-1 ratio. The analog signal distributor 32 is structured such that the analog signal(s) (50a, 50b, 50c, 50d) can be distributed to respective A-D converters (12a, 12b, 12c, 12d) in a 1—ratio and in a 1-4 ratio. For example, when the distribution control signal 60 specifying distribution in a 1—ratio is input to the analog distributor 32, the multiplexer 28b outputs the input signal from an input terminal group A (A1, A2, A3, A4), to each A-D converter (12a, 12b, 12c, 12d). The group A is connected to each analog signal input portion (10a, 10b, 10c, 10d) in a 1—manner, so that the analog signals (50a, 50b, 50c, 50d) are distributed to the A-D converters (12a, 12b, 12c, 12d), respectively.

When the distribution control signal 60 specifying distribution in a 1-4 ratio is input to the analog signal distributor 32, the mutliplexer 28b outputs the input signal from an input terminal group B (B1, B2, B3, B4), to each A-D converter (12a, 12b, 12c, 12d). The group B is connected to the multiplexer 28a, and the multiplexer 28a outputs a single analog signal from among the analog signals 50a, 50b, 50c and 50d which are input from the respective analog signal input portions (10a, 10b, 10c, 10d). Thus, one of the analog signals (50a, 50b, 50c, 50d) is distributed to each A-D converter (12a, 12b, 12c, 12d). Moreover, it is preferable that the analog signal distributor 32 may enjoy arbitrary ways of distributing, by varying the number and structure of the multiplexer(s).

FIG. 10A shows a distribution method for distribution of the analog signal to the A-D converter in a 1—manner. Referring both to FIG. 9 and to FIG. 10A, in a case where the signal is indicative of the distribution control signal 60 in the 1-1 manner, the input terminal group A (A1, A2, A3, A4) of the multiplexer 28b is selected. The analog signal (50a, 50b, 50c, 50d) input from the analog signal input portion (10a, 10b, 10c, 10d) is then distributed to the A-D converter (12a, 12b, 12c, 12d) in a 1—manner.

FIG. 10B shows a method of distributing the analog signal to the A-D converter in a 1-4 manner. Referring both to FIG. 9 and to FIG. 10B, in a case where the signal is indicative of the distribution control signal 60 in the 1-4 manner, the input terminal group B (B1, B2, B3, B4) of the multiplexer 28b is selected so that the multiplexer 28a selects one of the four input terminals. A single analog signal from among the analog signals 50a, 50b, 50c and 50d input from the analog signal input portions (10a, 10b, 10c, 10d) is then distributed to the four A-D converters (12a, 12b, 12c, 12d). In the example shown in FIG. 10B, the input terminal A of the multiplexer 28a is selected, and the input terminal group B (B1, B2, B3, B4) of the multiplexer 28b is selected. The analog signal 50a is then distributed to the A-D converters (12a, 12b, 12c, 12d). Since respective input terminals B, C and D of the multiplexer 28a are selected, one of corresponding analog signals 50b, 50c and 50d are distributed to the A-D converters (12a, 12b, 12c, 12d). FIG. 10C shows another preferred embodiment where a 1-2 distribution is adopted. Thus, any arbitrary distribution can be achieved upon demand.

FIG. 11A is a timing chart of the sampling clock signal for use with the averaging process, output from the sampling clock signal generator 14. In this embodiment, the mode specifying signal 58 is a binary signal, which is expressed by two voltage values, Hi (logical value "1") and Lo (logical value "0"). Hi specifies the interleave processing mode, and Lo specifies the averaging process mode. When the mode specifying signal 58 is Lo, the sampling clock signals (56a, 56b, 56c, 56d) are output in synchronization with the reference clock signal 54. The A-D converters 12a and 12b are sampling-operated based on the sampling clock signals 56a and 56b. The sampling timing of this sampling operation is synchronized with the reference clock signal 54.

FIG. 11B is a timing chart of the sampling clock signal for use with the interleave process, output from the sampling clock signal generator 14. When the mode specifying signal 58 is Hi, thereby specifying the interleave processing mode, the sampling clock signal 56a is output in a manner such that the frequency of the reference clock signal 54 is divided by four, while the sampling clock signals 56b, 56c and 56d are output such that a phase of the sampling clock signal 56a whose frequency is divided by four, is shifted further by ¼. The A-D converters 12a and 12b perform the sampling operation based on the sampling clock signals 56a and 56b. The sampling timing of this sampling operation is synchronized with the reference clock signal 54.

In general, in order for an A-D converter to convert an analog signal to a digital signal, a certain fixed period of time (sampling time) is required. Thus, the maximum sampling rate attainable by a single A-D converter during a fixed time is predetermined for the A-D converter in question. The interleaving process then becomes effective, which alternately operates a plurality of A-D converters. By implementing the above structure, in the event of performing the interleave process, A-D converters to be utilized can be selected according to sampling rate. For instance, when a semiconductor device whose sampling rate is fast is tested, four A-D converters are employed for the test. On the other hand, for example, when a semiconductor device whose sampling rate is slow is tested, a single A-D converter is employed for the test. Thus, a plurality of semiconductor devices can be tested simultaneously. Since the A-D converters to be utilized can be selected according to the characteristics of the semiconductor devices, the semiconductor devices can be tested in a most efficient manner.

Moreover, in a case of performing the averaging process, the A-D converter can be selected according to the resolution required for a specific measurement purpose. For example, when a semiconductor device where the analog signal needs to be measured at high resolution is tested, the device can be tested utilizing four A-D converters. As a further example, when a semiconductor device is tested and a low resolution suffices, a single A-D converter is used. In these cases, a plurality of semiconductor devices can be tested simultaneously. Thus, since A-D converter(s) can be selected to best suit the characteristics of the semiconductor device in question, very efficient semiconductor device testing can be performed. Therefore, the A-D converter(s) are selected in accordance with necessary processing contents for a semiconductor device under test.

Next, a calibration system is described which calibrates errors such as a time error caused between a plurality of A-D converters. In general, when the sampling operation is performed using a plurality of A-D converters, the time error occurs against a desired sampling clock due to characteristic differences between respective A-D converters and characteristic differences between the transfer paths of the sampling clock signals.

Figure 12:
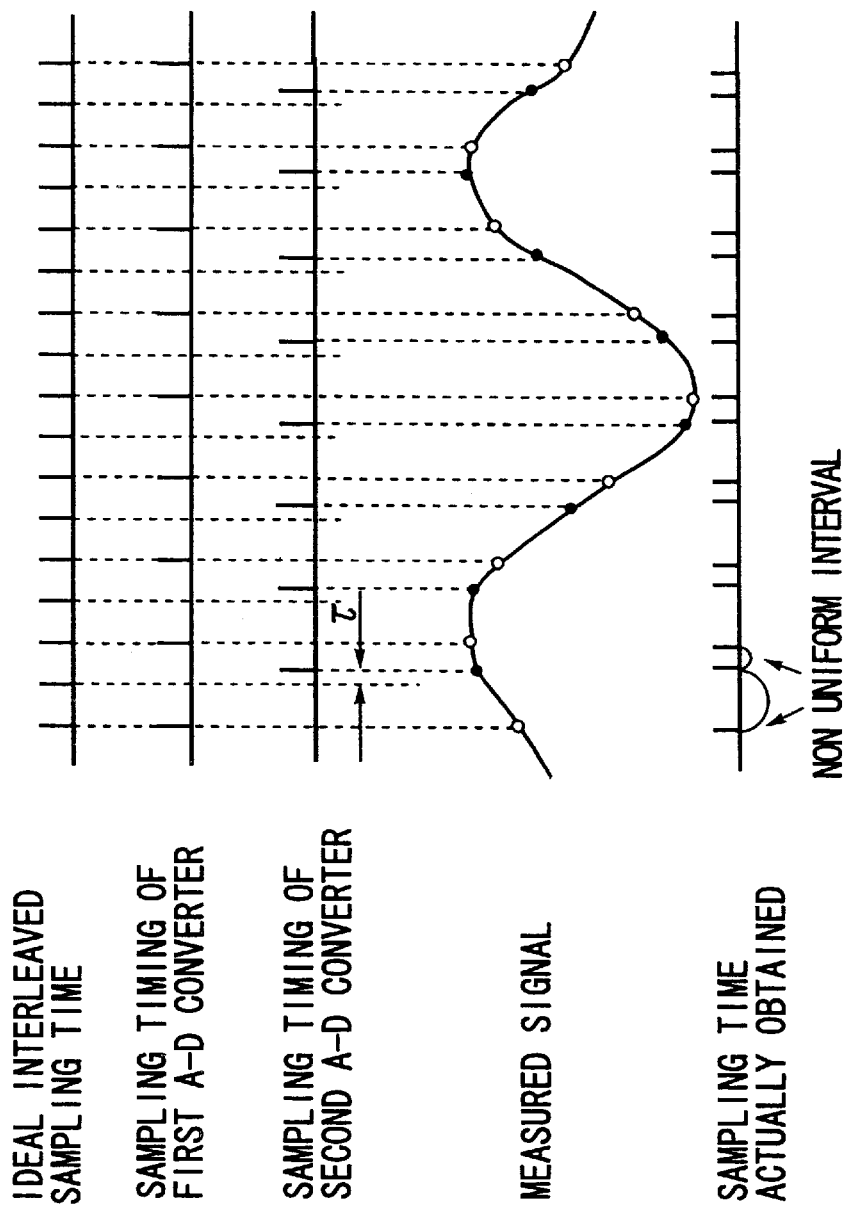
FIG. 12 illustrates the time-error of the sampling timing caused between two A-D converters that are the first A-D converter and the second A-D converter.

FIG. 12 illustrates the time error of the sampling timing caused between two A-D converters that are the first A-D converter and the second A-D converter. In general, when a plurality of A-D converters are alternately sampling-operated at a desirable time interval, a time displacement is caused, from the time when the sampling clock is input to the A-D converters until the actual sampling time. This time displacement is due to characteristic differences between respective A-D converters. Let this time error be denoted as $\tau$. The interleave process is performed utilizing two A-D converts in FIG. 12. Since the time required, from the input of the sampling clock until the actual sampling operation, differs between characteristics of the respective A-D converters, the time error $\tau$ occurs. When a signal to be measured is processed, utilizing the sample data obtained from the sampling operation preformed alternately on a plurality of A-D converters, the measured signal cannot be reproduced precisely unless the sampling timings have the same interval. Thus, the time error $\tau$ needs to be calibrated.

Figure 13:
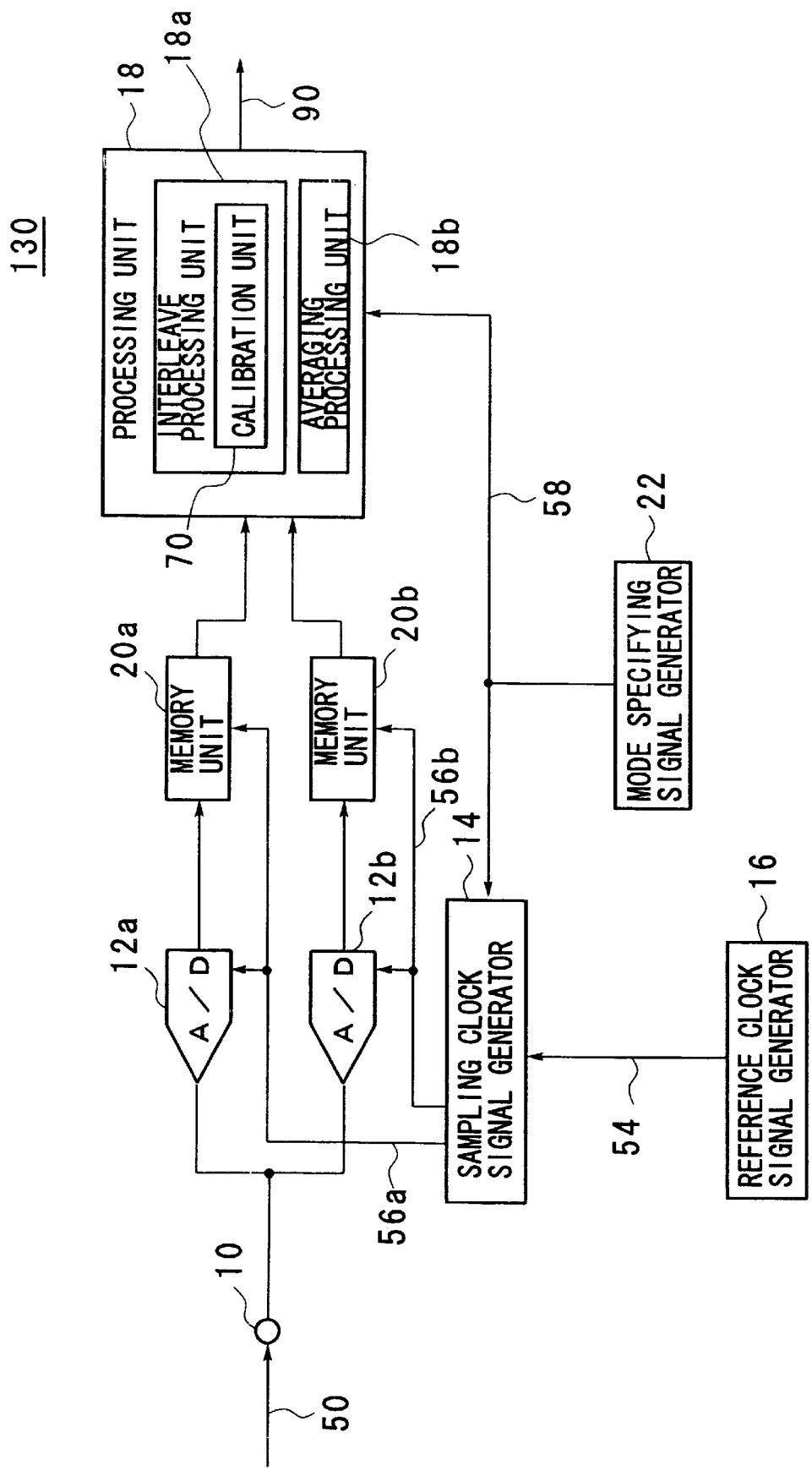
FIG. 13 shows an A-D converting apparatus 130 according to the third embodiment.

FIG. 13 shows an A-D converting apparatus 130 according to the third embodiment. The interleave processing unit 18a includes a calibration unit 70. Functional blocks shown in FIG. 13 having the same numbers as in FIG. 4 have identical functions, and their descriptions are thus omitted here. The calibration unit 70 calibrates errors caused between a plurality of A-D converters, so as to output an output signal 90. For example, the calibration unit 70 calibrates the time error, gain error and offset error. Thus, the A-D converting apparatus 130 is capable of outputting an output signal in which the errors caused between a plurality of A-D converters are calibrated.

Figure 14:
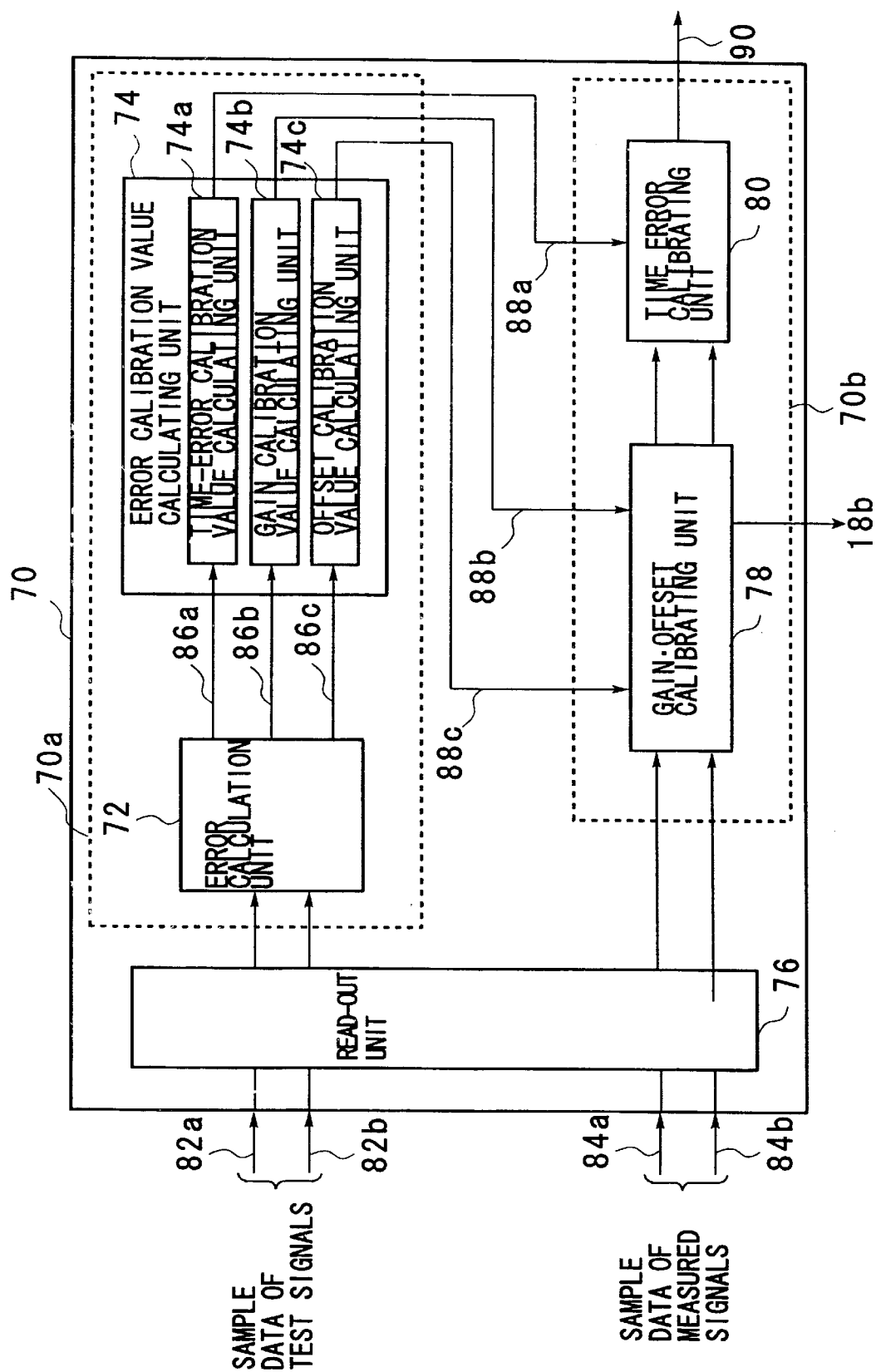
FIG. 14 shows a detailed structure of the calibration unit 70.

FIG. 14 shows a detailed structure of the calibration unit 70. The calibration unit 70 comprises a calibration-value calculating unit 70a, and error calibrating unit 70b and a read-out unit 76. The calibration value calculating unit 70a includes an error calculation unit 72 and an error calibration value calculating unit 74. The error calibration value calculating unit 74 includes a time-error calibration value calculating unit 74a, a gain calibration value calculating unit 74b and an offset calibration value unit 74c. The error calibrating unit 70b includes a gain-offset calibrating unit 78 and a time-error calibrating unit 80.

The read-out unit 76 reads sample data stored in either the memory unit 20a or the memory unit 20b so as to output the sample data to either the calibration-value calculating unit 70a or the error calibrating unit 70b. The error-calculating unit 72 calculates errors caused between a plurality of A-D converters, based on the sample data supplied from the read-out unit 76. For example, the error calculation unit 72 calculates the time error, gain error and offset error caused between a plurality of A-D converters, and outputs them to the error calibration value calculating unit 74. For example, the error calculation unit 72 may calculate error calibration values based on sample data of test signals for use in calculating the error calibrating values. For example, the test signals are preferably known signals such as a sinusoidal wave and cosine wave. Moreover, the error calculation unit 72 may calculate the error calculating values based on converted values obtained after the sample data are Fourier transformed.

The error calibration value calculation unit 74 calculates the error calibration value, based on the error supplied from the error calculation unit 72, so as to be output to the error calibrating unit 70b. For example, the error calibration value calculating unit 74 outputs to the error calibrating unit 70b the error calibration value for use in calibrating respective errors, based on the time error, gain error and offset error. The time error calibration value calculating unit 74a calculates a time error calibrating value 88a for use with the calculation in calibrating the time error, based on the time error supplied from the error calculation unit 72. The gain calibration value calculating unit 74b calculates a gain error calibrating value 88b for use with the calculation in calibrating the gain error, based on the gain error supplied from the error calculation unit 72. The offset calibration value calculating unit 74c calculates an offset error calibrating value 88c for use with the calculation in calibrating the offset, based on the offset error supplied from the error calculation unit 72. Thus, the calibration-value calculating unit 70a can calculate an error calibrating value for use with the calculation in calibrating errors caused between a plurality of A-D converters.

The error calibrating unit 70b calibrates the errors arising between a plurality of A-D converters, based on the error calibrating values supplied from the calibration-value calculating unit 70a, so as to output an output signal 90. The gain-offset calibrating unit 78 calibrates the gain error based on the gain-error calibrating value 88b. Moreover, the gain-offset calibrating unit 78 calibrates the offset error based on the offset error calibrating value 88c. The time-error calibrating unit 80 calibrates the time error based on the time-error calibrating value 88d. Thus, the error calibrating unit 70b can calibrate errors caused between a plurality of A-D converters. Since the calibration unit 70 can calibrate the errors caused in a plurality of A-D converters by performing the above calculations, the errors can be calibrated with high precision.

When the interleave process unit 18a is being selected by the mode specifying signal 58, the gain-offset calibrating unit 78 calibrates the gain error and offset error of the sample data, so as to be output to the time-error calibrating unit 80. The time-error calibrating unit 80 calibrates the time error and outputs the output signal 90. When the averaging processing unit 18 is being selected by the mode specifying unit signal 58, the gain-offset calibrating unit 78 calibrates the gain error and the offset error so as to be output to the averaging processing unit 18b. The averaging processing unit performs the averaging operation on the sample data 84a and 84b of the measured signals, whose gain error and offset error are calibrated.

Next, an exemplary method of calculating the error calibration value in the calibration-value calculating unit 70a will be described. In order that the error calibration value can be calculated based on errors between a plurality of A-D converters, a test signal is input to the two A-D converters 12a and 12b to be error-calibrated, so as to perform the sampling operation. For example, a sinusoidal wave of $\sin(2\pi \cdot f \cdot t)$ serves as the test signal, where f indicates a given frequency and t indicates the time.

The sample data of the test signals 82a and 82b, which are sampled by respective A-D converters and are digitized, are stored in the memory units 20a and 20b. The read-out unit 76 reads the sample data 82a and 82b of the test signals out of the memory units 20a and 20b, and outputs the sample data 82a and 82b to the error calculatiion unit 72. The error calculation unit 72 respectively performs the Discrete Fourier Transformation (DFT) on the sample data 82a and 82b of the input test signals. The results obtained from this Discrete Fourier Transformation (DFT) are expressed by:

The output signal from the first A-D converter→$A1 \sin(2\pi ft + \phi1) + B1$

The output signal from the second A-D converters→$A2 \sin(2\pi ft + \phi2) + B2$ Here, A1 and A2 denote gains, while B1 and B2 offsets. $\phi1$ and $\phi2$ are initial values determined by clock input timings for the first and second A-D converters, respectively.

Moreover, when the time interval of the sampling operation between respective A-D converters is 2Ts (i.e. f=1/2Ts) and the sampling timing of the A-D converters 12a and 12b is displaced by the phase of Ts+τ time (where τ indicates the time-error) the following equation holds. Let the time-error τ be the time error 86a, and the gains A1 and A2 be the gain 86b, and let the offsets B1 and B2 be the offset 86c in FIG. 14.

$$\phi2 - \phi1 = 2\pi f(T_s + \tau)$$
$$= 2\pi \frac{1}{2T_s}(T_s + \tau)$$
$$= \pi\left(1 + \frac{\tau}{T_s}\right)$$

Thus, the time error τ is expressed by:

$$\tau = \frac{T_s}{\pi}(\phi2 - \phi1) - T_s$$

The error calculation unit 72 outputs the time error τ to the time-error calibration value calculating unit 74a. The error calculation unit 72 outputs the gains A1 and A2 to the gain calibration value calculating unit 74b. The error calculation unit 72 outputs the offsets B1 and B2 to the offset calibration value calculating unit 74c.

The time-error calibration value calculating unit 74a calculates the time error calibration value 88a based on the time error τ supplied from the error calculation unit 72. For example, the time-error calibration value calculating unit 74a calculates the time-error calibration value 88a in the following manner.

Let two sampling timings be denoted with even and odd subscripts attached thereto. Assume that the phase of the sampling time with the odd subscript is displaced by Ts+τ time against the phase of the sampling time with the even subscript, and let the Fourier transformed results of the sampling timings be denoted $P_{even}$ and $P_{odd}$ respectively. Then the following equations (1) and (2) hold:

$$P_{even}(f) = \frac{1}{2T_s} \sum_{k=-\infty}^{\infty} \delta\left(f - \frac{k}{2T_s}\right) \quad (1)$$

$$P_{odd}(f) = e^{-j\omega k(\tau+T_s)} \frac{1}{2T_s} \sum_{k=-\infty}^{\infty} \delta\left(f - \frac{k}{2T_s}\right) \quad (2)$$

$$= e^{-j2\pi f_0 k(\tau+T_s)} \frac{1}{2T_s} \sum_{k=-\infty}^{\infty} \delta\left(f - \frac{k}{2T_s}\right)$$

δ denotes the delta function

The Fourier transformations $\tilde{X}$ of a waveform X which is sampled at the sampling time expressed in the above equations (1) and (2) are expressed by the following equations (3) and (4), if the sample data of the waveform X is $\overline{X}$.

$$\tilde{X}_{even}(f) = \overline{X}(f) \cdot P_{even}(f) \quad (3)$$

$$= \frac{1}{2T_s} \sum_{k=-\infty}^{\infty} \overline{X}\left(f - \frac{k}{2T_s}\right)$$

$$\tilde{X}_{odd}(f) = \overline{X}(f) \cdot P_{odd}(f) \quad (4)$$

$$= \frac{1}{2T_s} \sum_{k=-\infty}^{\infty} \overline{X}\left(f - \frac{k}{2T_s}\right) \cdot e^{-j2\pi f_0 k(\tau+T_s)}$$

$$= \frac{1}{2T_s} \sum_{k=-\infty}^{\infty} \overline{X}\left(f - \frac{k}{2T_s}\right) \cdot e^{-j2\pi \frac{1}{2T_s} k(\tau+T_s)}$$

$$= \frac{1}{2T_s} \sum_{k=-\infty}^{\infty} \overline{X}\left(f - \frac{k}{2T_s}\right) \cdot e^{-j\pi k\left(1+\frac{\tau}{T_s}\right)}$$

The Fourier transformed result of these two waveforms having been interleave processed is obtained below using the equations (3) and (4).

$$\tilde{X}(f) = \tilde{X}_{even}(f) + \tilde{X}_{odd}(f) \quad (5)$$

$$= \frac{1}{2T_s} \sum_{k=-\infty}^{\infty} \overline{X}\left(f - \frac{k}{2T_s}\right) + \frac{1}{2T_s} \sum_{k=-\infty}^{\infty} \overline{X}\left(f - \frac{k}{2T_s}\right) \cdot e^{-j\pi k\left(1+\frac{\tau}{T_s}\right)}$$

$$= \frac{1}{2T_s} \sum_{k=-\infty}^{\infty} \left(1 + e^{-j\pi k\left(1+\frac{\tau}{T_s}\right)}\right) \overline{X}\left(f - \frac{k}{2T_s}\right)$$

When the error τ is caused between the two A-D converters (12a and 12b), the same frequency term as the sampling frequency (1/2Ts) in the Fourier transformation differs from that where error τ is not caused. The time error calibration value calculating unit 74a calibrates the time error, so that the same frequency term as the sampling frequency in the Fourier transformation can coincide with the frequency term where time error τ is not caused.

A value of the sampling frequency (1/2Ts) term in a case where the time error τ is caused, is obtained by substituting k=1 into the equation (5), and is expressed by the following equation (6).

$$\left(1 + e^{-j\pi\left(1+\frac{\tau}{T_s}\right)}\right) \cdot \overline{X}\left(f - \frac{1}{2T_s}\right) \quad (6)$$

On the other hand, the sampling frequency (1/2Ts) term in a case where the time error τ is not caused at the sampling timing of the two A-D converters 12a and 12b, is given by the following equation (7).

$$(1 + e^{-j\pi T_s}) \cdot \overline{X}\left(f - \frac{1}{2T_s}\right) = \quad (7)$$

$$\left(1 + e^{-j2\pi \frac{1}{2\pi} T_s}\right) \cdot \overline{X}\left(f - \frac{1}{2T_s}\right) = (1 + e^{-j\pi}) \cdot \overline{X}\left(f - \frac{1}{2T_s}\right)$$

Then, the calibration is performed in order to remove the term τ/Ts from $e^{-j\pi(1+\tau/T_s)}$ in the equation (6) such that $e^{j\pi(1+\tau/T_s)}$ becomes $e^{-j\pi}$ shown in the equation (7).

Thus, when the time-error calibration value 88a is denoted Y, we have:

$$e^{-j\pi\left(1+\frac{\tau}{T_s}\right)} \cdot Y = e^{-j\pi}$$

Therefore, we obtain:

$$Y = e^{-j\pi} \cdot e^{j\pi\left(1+\frac{\tau}{T_s}\right)} \quad (8)$$

$$= e^{-j\pi + j\pi + j\pi \frac{\tau}{T_s}}$$

$$= e^{j\pi \frac{\tau}{T_s}}$$

Then, this time-error calibration value 88a is multiplied with the Fourier transformed value of the sample data of the A-D converters which sampling-operate at the sampling timing $P_{odd}$.

The gain calibration value calculating unit 74b calibrates the gain calibration value 88b based on the input gain 86b. There are several methods of calculating the gain calibration value 88b. For example, a reciprocal of the gain 86b preferably serves as the gain calibration value 88b. In other words, if the gain 86b is A1, then the gain calibrating value 88b will be 1/A1.

The offset calibration value calculating unit 74c calculates the offset calibration value 88c based on the input offset 86c. Though there are several methods of calculating this offset calibrating value 88c, in the present embodiment, for example, a value in which the sign of the offset 86c is changed, serves preferably as the offset calibration value 88c. For example, if the offset 86c is B1, then the offset calibration value 88c will be -B1. In the above-mentioned manners, the calibration value calculation unit 70a calculates the time-error calibration value 88a, the gain calibration value 88b and the offset calibration value 88c.

Next, the error calibrating unit 70b will be described, which calibrates the error based on the sample data obtained by sampling the measured signals output from the semiconductor device 98, the time-error calibrated value 88a which has been calculated in advance in the calibration-value calculating unit 70a, the gain calibrating value 88b and the offset calibrating value 88c.

The read-out unit 76 reads the sample data (84a and 84b) obtained by sampling the measured signals, out of the memory units 20a and 20b, so as to be output to the gain-offset calibrating unit 78. The gain-offset calibrating unit 78 calibrates the gain and offset of the sample data (84a and 84b) of the input measured signals, based on the sample data (84a and 84b) of the measured signals supplied from the read-out unit 76, the gain calibrating value 88b and the offset calibrating value 88c. Though there are several ways of calibration, the following method is preferable in the present embodiment.

Let the sample data be denoted D(t), the value of the gain and offset after calibration D' (t), the gain calibrating value 88b be G, and the offset calibrating value 88c be O. Then, the following equation holds.

$$D'(t) = G \cdot D(t) + O$$

By performing the above calculation on the sample data 84a and 84b of the measured signals, the gain and offset contained in each sampled data can be calibrated. The sample data 84a and 84b of the measured signals, whose gain and offset are calibrated by the gain-offset calibrating unit 78, are input to the time-error calibrating unit 80.

The time-error calibrating unit 80 performs a transformation, such that a time component is added to the sample data 84a and 84b of the measured signal whose input gain and offset are calibrated. In this transformation, the time component is added to the sample data 84a and 84b of the measured signals, so that the input analog signal can be reconstructed. Since the sample data output from the A-D converters does not contain the time component, it is necessary to include the time component in order to reconstruct a waveform from the sample data. For example, the Fourier transformation serves such a purpose. In the present embodiment, the Discrete Fourier Transformation is used.

The time-error calibration is performed based on the discrete Fourier transformed result and the time-error calibrating value 88a. Though there are several ways of calibrating the time-error, for example, the following method is used in the present embodiment.

Let the error calibrated waveform output in the Fourier transformed form be denoted.

$$\tilde{X}\left(\frac{k}{NT_s}\right).$$

The sample data obtained from the A-D converters, which are operated at the sampling timing with an even subscript are Fourier transformed and denoted by $$\tilde{X}_{even}\left(\frac{k}{NT_s}\right).$$

The sample data obtained from the A-D converters which are operated at the sampling timing with an odd subscript, whose phase is delayed by Ts+τ against the sampling-timing with an even subscript, is Fourier transformed and denoted by $$\tilde{X}_{odd}\left(\frac{k}{NT_s}\right).$$

When the time-error τ is calibrated using $$e^{j\pi \frac{\tau}{T_s}}$$

which serves as the time-error calibrating value 88a, we obtain the following results.

$$\tilde{X}\left(\frac{k}{NT_s}\right) = \tilde{X}_{even}\left(\frac{k}{NT_s}\right) + e^{j\pi \frac{\tau}{T_s}} \tilde{X}_{odd}\left(\frac{k}{NT_s}\right)$$

$$= DFT_{even}(k) + e^{j\pi \frac{\tau}{T_s}} \cdot e^{-j\pi(T_s+\tau)\frac{k}{NT_s}} \cdot DFT_{odd}(k)$$

Where $$e^{-j\pi(T_s+\tau)\frac{k}{NT_s}}$$

is a time delay component, and indicates that the sampling timing with an odd subscript is delayed by Ts+τ compared to the sampling timing with an even subscript.

Thus, using the above calculation, the time-error calibrating unit 80 can output the output signal 90 in which the gain, offset and time-error are calibrated. It is preferable that the calibration unit 70 which calibrates the above-described gain, offset and time-error be realized by a computing unit that performs predetermined processes using programs. For example, a computer such as a workstation that performs predetermined processes by programs, may serve as the computing unit. By realizing the calibrating unit 70 by utilizing such a computing unit, there is no need to provide hardware such as a variable resistor and delay circuit necessary for the error calibration. This is a very significant advantageous aspect of the present embodiment. Moreover, since the calibration is performed by a computation that is software, the performance does not depend on the characteristics of elements such as the delay circuit, thus realizing high-precision calibration. Therefore, the present embodiment provides a recording medium which records programs, realizing the computing unit as the present calibration unit 70.

Moreover, since the calibration is performed based on the sample data, the errors contained in sample data measured by the conventional A-D converting apparatus that converts the analog signal to the digital signal, can also be calibrated by using the above calibration scheme according to the present embodiments. By implementing the above configuration, there is no need to provide elements such as the delay circuit and variable resistor as means for calibrating the time-error, gain and offset, so that error calibration can be easily achieved. Moreover, since the range in which the error can be calibrated does not depend on the performance of elements such as the delay circuit, high-precision calibration is achieved.

Figure 15:
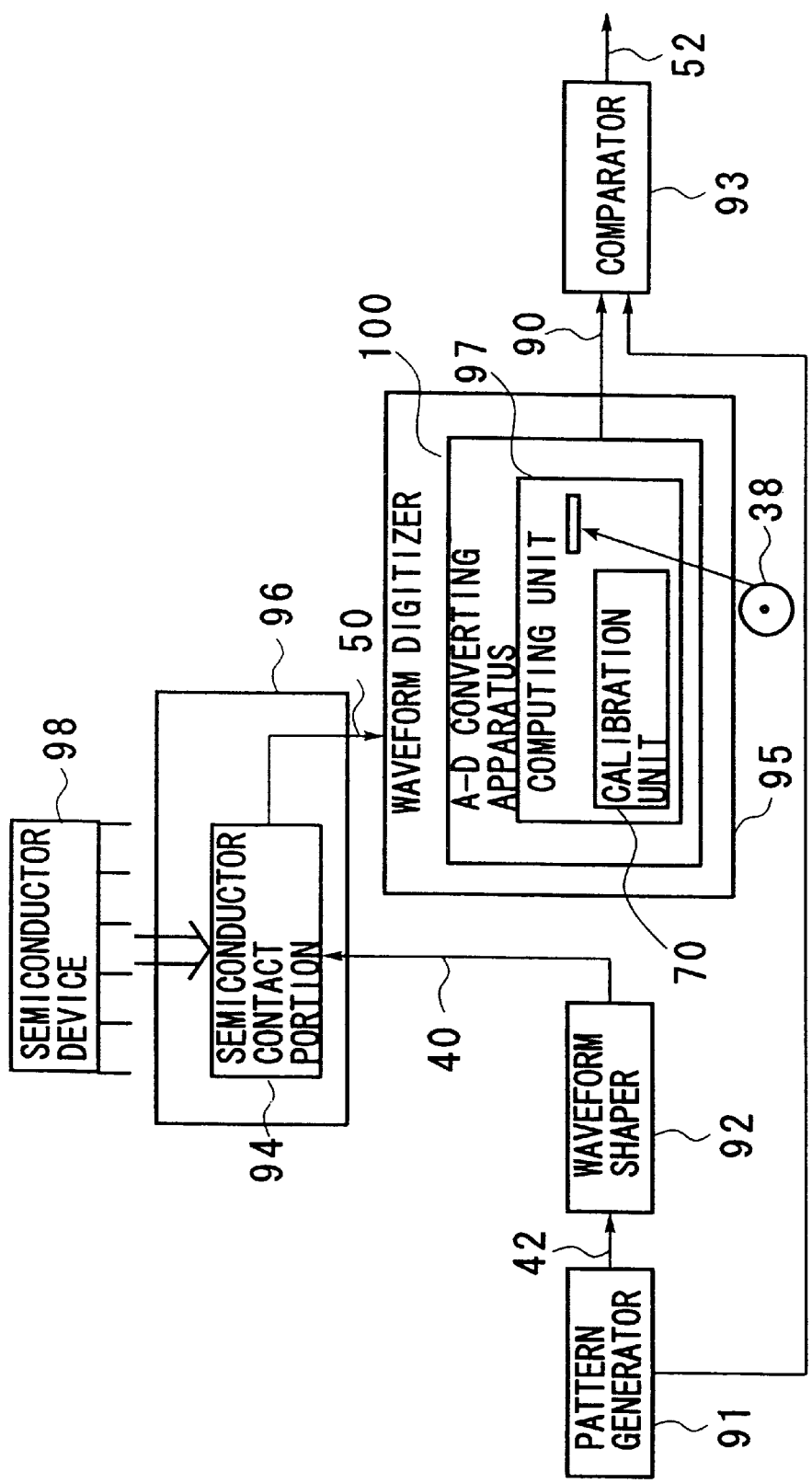
FIG. 15 shows a semiconductor device testing apparatus, which tests an analog-signal-outputting semiconductor device, according to the fourth embodiment.

FIG. 15 shows a semiconductor device testing apparatus which tests an analog-signal-outputting semiconductor device, according to the fourth embodiment. This semiconductor device testing apparatus comprises a waveform digitizer 95 including a computing unit 97 and an A-D converting apparatus 100, a recording medium 38, a pattern generator 91, a waveform shaper 92, a comparator 93 and a performance board having a semiconductor device contact portion 94. In the present embodiment, the calibration unit 70 is realized by utilizing the computing unit 97 based on the program recorded in the recording medium 38. A general-use computer such as a workstation or the like is preferable as the computing unit 97.

The semiconductor device 98, which outputs an analog signal to be tested, is placed in the semiconductor device contact portion 94. For example, a socket which electrically connects an input terminal of the semiconductor device 98 may serve as the semiconductor device contact portion 94. The pattern generator 91 generates a semiconductor device input signal 42 which is to be supplied to the semiconductor device 98, so as to be output to the waveform shaper 92.

Moreover, the pattern generator 91 outputs to the comparator 93, a theoretical value to be output from the semiconductor device 98. The waveform shaper 92 shapes the semiconductor device input signal 42 according to the characteristics of the semiconductor 98, so as to be output to the semiconductor device contact portion 94. The semiconductor device contact portion 94 outputs to the semiconductor device 98, the semiconductor device input signal 40 supplied from the waveform shaper 92. The semiconductor device 98 outputs the analog signal 50 to the semiconductor device contact portion 94 based on the thus input semiconductor device input signal 40. The semiconductor device contact portion 94 outputs to the A-D converting apparatus 100 the analog signal 50 which is a to-be-measured signal. In the A-D converting apparatus 100, the analog signal 50 supplied from the semiconductor device contact portion 94 is converted to a digital signal.

The A-D converting apparatus 100 is the one shown in FIG. 4 according to the first embodiment, and the input analog signal 50 is processed by either the averaging process or the interleave processing. Furthermore, the A-D converting apparatus 100 shown in FIG. 15 may be equipped with the calibration unit 70, shown in FIG. 13 according to the third embodiment, which calibrates the time-error arising between a plurality of A-D converters, so that the error-calibrated output signal 90 can be output. The comparator 93 determines the final quality of the semiconductor 98 under test based on the error calibrated output signal 90 and the theoretical value supplied from the pattern generator 91, so as to output a judgment signal 52. By implementing this structure, two processes consisting of the averaging process and interleave processing can be performed by a single testing apparatus. Moreover, an advantageous semiconductor device testing apparatus is provided which can easily calibrate the time error arising between a plurality of A-D converters.

Figure 16:
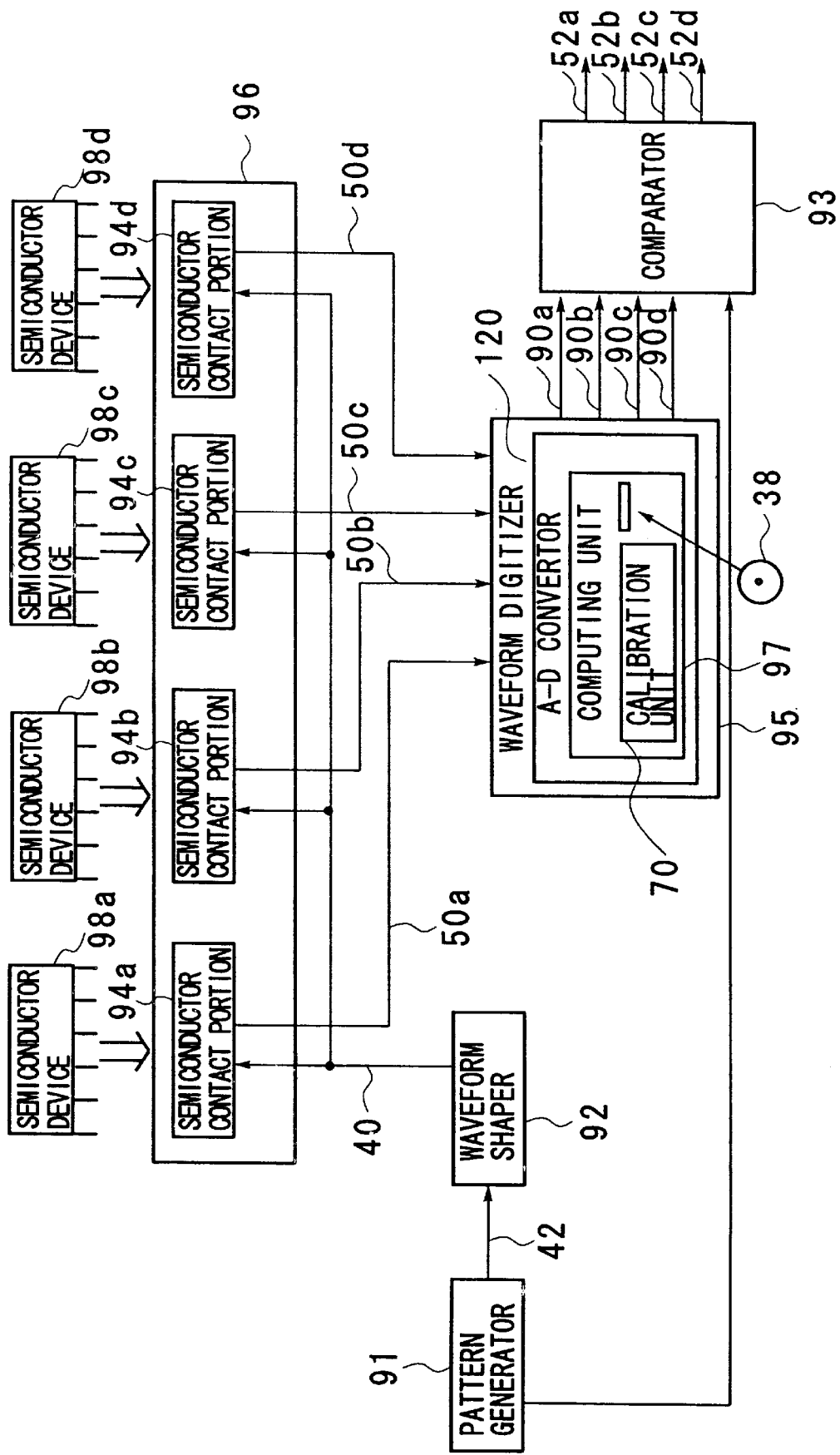
FIG. 16 shows a semiconductor device testing apparatus which tests a plurality of analog-signal-outputting semiconductor devices, according to the fifth embodiment.

FIG. 16 shows a semiconductor device testing apparatus which tests a plurality of analog-signal-outputting semiconductor devices, according to the fifth embodiment. This semiconductor device testing apparatus comprises a waveform digitizer 95 including a computing unit 97 and an A-D converting unit 100, a recording medium 38, a pattern generator 91, a waveform shaper 92, a comparator 93 and a performance board 96 having a plurality of semiconductor device contact portions (94a, 94b, 94c, 94d). In this present embodiment, the calibrating unit 70 is realized by utilizing the computing unit 97, based on the program recorded in the recording medium 38. A general-use computer such as a workstation or the like is preferable as the computing unit 97.

The pattern generator 91 generates a semiconductor device input signal 42 to be supplied to the semiconductor devices (98a, 98b, 98c, 98d), so as to be output to the waveform shaper 92. Moreover, the pattern generator 91 outputs to the comparator 93 a theoretical value which is to be output from the semiconductor devices (98a, 98b, 98c, 98d). The waveform shaper 92 shapes the semiconductor device input signal 42 supplied from the pattern generator 91 according to the characteristics of the semiconductor devices (98s, 98b, 98c, 98d), so as to be output to semiconductor contact portions (94a, 94b, 94c, 94d). The semiconductor device contact portions (94a, 94b, 94c, 94d) supplies the semiconductor input signal 40 fed from the waveform shaper 92 to respective semiconductor devices (98a, 98b, 98c, 98d). The semiconductor devices (98a, 98b, 98c, 98d) output analog signals (50a, 50b, 50c, 50d) to the semiconductor device contact portion (94a, 94b, 94d), based on the thus-input semiconductor device input signal 40. The semiconductor contact portions (94a, 94b, 94c, 94d) output the analog signals (50a, 50b, 50c, 50d) to the A-D converting apparatus 100.

The A-D converting apparatus 120 in this fifth embodiment is the one shown in FIG. 8 according to the second embodiment, and the input analog signals 50a, 50b, 50c and 50d are processed by either the averaging process or the interleave processing. Furthermore, the A-D converting apparatus 120 shown in FIG. 16 may be equipped with the calibration unit 70, shown in FIG. 13 according to the third embodiment, which calibrates the time error arising between a plurality of A-D converters, so that the error-calibrated output signals 90a, 90b, 90c and 90d can be output. The comparator 93 determines the final quality of the semiconductor 98 under test based on the error calibrated output signals (90a, 90b, 90c, 90d) and the theoretical value supplied from the pattern generator 91, so as to output judgment signals 52a, 52b, 52c and 52d. Since the A-D converting apparatus 120 described with reference to FIG. 8 has the analog signal distributor 32, a single A-D converter or plural A-D converters to be used for the processing can be utilized selectively according to a processing content of the analog signal. By implementing this structure, two processes consisting of the averaging process and interleave processing can be performed by a single testing apparatus. Moreover, an advantageous semiconductor device testing apparatus is provided which can easily calibrate the time error arising between a plurality of A-D converters.

As apparent from the above, the averaging process which sampling operates a plurality of A-D converters simultaneously and the interleave process which sampling-operates a plurality of A-D converters alternately can be realized by a single A-D converting apparatus 120. Moreover, the A-D converter(s) to be used for the processing can be selectively changed in accordance with the processing content of the analog signal. Moreover, calibration of the time error arising between a plurality of A-D converters can be performed using the computing unit, thereby the time error can be calibrated without using the delay circuit.

Although the present invention has been described by way of exemplary embodiments, it should be understood that many changes and substitutions may be made by those skilled in the art without departing from the spirit and the scope of the present invention which is defined only by the appended claims.

What is claimed is:

1. Analog-to-digital (A-D) converting apparatus which samples an analog signal output from a semiconductor device to produce a digital signal, the A-D converting apparatus comprising:

an analog signal input portion which inputs the analog signal;

a plurality of analog-to-digital (A-D) converters which sample the analog signal input at said analog signal input portion, and convert the analog signal to the digital signal;

a sampling clock signal generator which supplies either a synchronous sampling clock signal for use with an averaging process so as to sampling-operate said plurality of A-D converters in a synchronized manner, or an alternate sampling clock signal for use with an interleave process so as to alternately sampling-operate said plurality of A-D converters;

an averaging processing unit which performs the averaging process on the digital signal output from said sampling-operated A-D converters, based on the synchronous sampling clock signal; and an interleave processing unit which interleaves the digital signal output from said sampling operated A-D converters based on the alternate sampling clock signal.

2. A-D converting apparatus of claim 1, further comprising a mode specifying signal generator which generates a mode specifying signal which specifies either the averaging process or the interleave process, whereby either the averaging process unit or the interleave processing unit is selected based on the mode specifying signal.

3. A-D converting apparatus of claim 2, further comprising a reference clock signal generator which generates a reference clock signal, wherein said sampling clock signal generator supplies the synchronous sampling clock signals synchronized with the reference clock signal to said respective A-D converters in the event that the averaging process is specified by the mode specifying signal while said sampling clock signal generator supplies the alternate sampling clock signal each having a different phase from other to said respective A-D converters in the event that the interleave process is specified by the mode specifying signal.

4. A-D converting apparatus of claim 1, further comprising a plurality of memory units which store the digital signals output from said respective plurality of A-D converters, wherein said averaging processing unit and said interleave processing unit perform the averaging process and the interleave process, respectively, based on the digital signal stored in said plurality of memory units.

5. A-D converting apparatus of claim 4, said plurality of A-D converters including a first A-D converter and a second A-D converter, further comprising:

an error calculation unit which calculates a time error which is a time displacement between a predetermined timing sampled by the second A-D converter against that sampled by the first A-D converter and an actual timing sampled by the second A-D converter;

an error calibration value calculating unit which calculates a time error calibration value for use with calculation of calibrating the time error of said second A-D converter, based on the time error calculated by said error calculation unit;

a read-out unit which reads the digital signal from said memory units which store the digital signal obtained by sampling a measured signal that is the analog signal to be measured; and an error calibrating unit which performs a calibration operation on the time error caused in the second A-D converter in the event of sampling the measured signal, based on the digital signal read out of said memory units by said read-out unit and the time error calibration value calculated by said error calibration value calculating unit.

6. Analog-to-digital (A-D) converting apparatus which samples an analog signal output from a semiconductor device to produce a digital signal, the A-D converting apparatus comprising:

an analog signal input portion which inputs the analog signal;

an adder which adds up the digital signal output from a first A-D converter which sampling-operates the analog signal so as to be converted to the digital signal, and the digital signal output from a second A-D converter which sampling-operates the analog signal so as to be converted to the digital signal;

a multiplexer which alternately inputs the digital signal output from the first A-D converter and the digital signal output from the second A-D converter so as to be sequentially output; and a selector which selects either an output value from said adder or an output value from said multiplexer.

7. Analog-to-digital (A-D) converting apparatus which samples an analog signal output from a semiconductor device to produce a digital signal, the A-D converting apparatus comprising:

an analog signal input portion which inputs the analog signal;

a plurality of analog-to-digital (A-D) converters which perform sampling operation on the analog signal input at said analog signal input portion, and convert the analog signal to the digital signal; and an analog signal distributor which distributes the digital signal to a single of or plurality of said A-D converters depending on a content of how the analog signal is converted to the digital signal.

8. A-D converting apparatus of claim 7, wherein said plurality of A-D converters are provided for each of said corresponding plurality of analog signal input portions, and wherein the analog signal input from said analog signal input portion is distributed to a plurality of said A-D converters.

9. A-D converting apparatus of claim 7, further comprising:

a sampling clock signal generator which supplies either a synchronous sampling clock signal for use with an averaging process so as to sampling-operate said plurality of A-D converters in a synchronized manner, or an alternate sampling clock signal for use with an interleave process so as to alternately sampling-operate said plurality of A-D converters;

an averaging processing unit which performs the averaging process on the digital signal output from the sampling-operated A-D converters, based on the synchronous sampling clock signal; and an interleave processing unit interleaves the digital signal output from the sampling operated A-D converters, based on the alternate sampling clock signal.

10. A-D converting apparatus of claim 9, further comprising:

a mode specifying signal generator which generates a mode specifying signal which specifies either the averaging process or the interleave process, whereby either the averaging process unit or the interleave processing unit is selected based on the mode specifying signal; and a distribution control signal generator which supplies to said analog signal distributor a distribution control signal specifying that the analog signal be distributed to one of or plurality of said A-D converters, based on a process specified by the mode specifying signal.

11. Calibration apparatus which calibrates an error arising between a first A-D converter that performs sampling operation on an analog signal output from a semiconductor device so as to be converted to a digital signal and a second A-D converter that performs sampling operation on the analog signal so as to be converted to a digital signal, the calibration apparatus comprising:

an error calculation unit which calculates a time error which is a time displacement between a predetermined timing sampled by the second A-D converter against that sampled by the first A-D converter and an actual timing sampled by the second A-D converter samples, based on sample data obtained by sampling a test signal for use in calculating the time error;

an error calibration value calculating unit which calculates a time error calibration value for use with calculation of calibrating the time error of the second A-D converter, based on the time error calculated by said error calculation unit;

a read-out unit which reads the digital signal from a memory unit which stores the sample data obtained by sampling a measured signal that is the analog signal to be measured; and an error calibrating unit which performs a calibration operation on the time error caused in the second A-D converter in the event of sampling the measured signal, based on the sample data read out of the memory unit by said read-out unit and the time error calibration value calculated by said error calibration value calculating unit.

12. Calibration apparatus of claim 11, wherein said error calibrating unit performs discrete Fourier transformation on the sample data of the measured signal read out of the memory unit by said read-out unit, and calibrates the time error based on a discrete Fourier transformed value obtained from the discrete Fourier transformation and the time error calibration value.

13. Calibration apparatus of claim 11, wherein said error calculation unit calculates a gain and offset of the first and second A-D converters, wherein said error calibration value calculating unit includes: a gain calibration value calculating unit which calculates a gain calibration value of the first and second A-D converters; and an offset calibration value calculating unit which calculates an offset calibration value of the first and second A-D converters, and wherein said error calibrating unit includes a gain-offset calibrating unit which calibrates the gain and offset of the first and second A-D converters, based on the sample data of the measured signal read out of the memory unit by said read-out unit, the gain calibration value and the offset calibration value.

14. Calibration apparatus of claim 13, wherein said gain-offset calibrating unit performs a calibrating operation such that the gain calibration value is multiplied to the sample value of the measured signal sampled by the second A-D converter and then the offset calibration value is added.

15. A method of calibrating an error arising between a first A-D converter which performs sampling operation on an analog signal to produce a digital signal so as to be converted to a digital signal and a second A-D converter which performs sampling operation on the analog signal so as to be converted to a digital signal, the error calibrating method comprising:

calculating a time error which is a time displacement between a predetermined timing sampled by the second A-D converter against that sampled by the first A-D converter and an actual timing sample by the second A-D converter;

calculating a time error calibration value for use with calculation of calibrating the time error, based on the time error; and calibrating the time error based on sample data obtained by sampling a signal to be measured and the time error calibration value.

16. A method of claim 15, further comprising:

calculating gain and offset of the first and second A-D converters;

calculating gain calibration value and offset calibration value for use with calculation of calibrating the gain and offset based on the gain and offset calculating by said calculating the gain and offset; and calibrating the gain and offset of the first and second A-D converters, based on the sample data obtained by sampling the signal to be measured, the gain calibration value and the offset calibrating value.

17. Semiconductor device testing apparatus for testing a semiconductor device that outputs an analog signal, comprising:

a pattern generator which generates a semiconductor device input signal for testing the semiconductor device;

a performance board which supplies to the semiconductor device the semiconductor device input signal output from said pattern generator;

an analog signal input portion which inputs the analog signal output from the semiconductor device;

a plurality of analog-to-digital (A-D) converters which perform sampling operation on the analog signal input at said analog signal input portion, and convert the analog signal to a digital signal;

a sampling clock signal generator which supplies either a synchronous sampling clock signal for use with an averaging process so as to sampling-operate said plurality of A-D converters in a synchronized manner, or an alternate sampling clock signal for use with an interleave process so as to alternately sampling-operate said plurality of A-D converters;

an averaging processing unit which performs the averaging process on the digital signal output from said sampling-operated A-D converters, based on the synchronous sampling clock signal; and an interleave processing unit which interleaves the digital signal output from said sampling operated A-D converters, based on the alternate sampling clock signal.

18. Semiconductor device testing apparatus of claim 17, said plurality of A-D converters including a first A-D converter and a second A-D converter, further comprising:

an error calculation unit which calculates a time error which is a time displacement between a predetermined timing sampled by the second A-D converter against that sampled by the first A-D converter and an actual timing sampled by the second A-D converter;

an error calibration value calculating unit which calculates a time error calibration value for use with calculation of calibrating the time error of said second A-D converter, based on the time error calculated by said error calculation unit;

a read-out unit, connected to said error calculation unit, which reads the digital signal from a memory unit which stores the digital signal obtained by sampling a measured signal that is the analog signal to be measured; and an error calibrating unit which performs a calibration operation on the time error caused in the second A-D converter in the event of sampling the measured signal, based on the sample data read out of the memory unit and the time error calibration value calculated by said error calibration value calculating unit.

* * * * *